(12) United States Patent
Haneda

(10) Patent No.: US 9,083,370 B2
(45) Date of Patent: *Jul. 14, 2015

(54) A/D CONVERTER CIRCUIT, ELECTRONIC APPARATUS AND A/D CONVERSION METHOD

(71) Applicant: SEIKO EPSON CORPORATION, Tokyo (JP)

(72) Inventor: Hideo Haneda, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 89 days.

This patent is subject to a terminal disclaimer.

(21) Appl. No.: 13/910,458

(22) Filed: Jun. 5, 2013

(65) Prior Publication Data

US 2013/0265181 A1   Oct. 10, 2013

Related U.S. Application Data

(63) Continuation of application No. 13/267,289, filed on Oct. 6, 2011, now Pat. No. 8,482,446.

(30) Foreign Application Priority Data

Nov. 8, 2010   (JP) ................. 2010-249949

(51) Int. Cl.
*H03M 1/34* (2006.01)
*H03M 1/12* (2006.01)
*H03M 1/10* (2006.01)
*H03M 1/46* (2006.01)

(52) U.S. Cl.
CPC .............. *H03M 1/12* (2013.01); *H03M 1/1019* (2013.01); *H03M 1/468* (2013.01)

(58) Field of Classification Search
CPC ............................ H03M 3/384; G01R 27/2605
USPC .................. 341/163, 120, 155, 144, 118, 172
See application file for complete search history.

(56) References Cited

U.S. PATENT DOCUMENTS

| 5,272,481 | A | 12/1993 | Bauer |
| 5,870,052 | A | 2/1999 | Dedic et al. |
| 7,409,199 | B2 | 8/2008 | Igarashi et al. |
| 7,446,684 | B2 * | 11/2008 | Huang ................ 341/139 |
| 7,567,196 | B2 | 7/2009 | Boemler |
| 7,880,650 | B2 | 2/2011 | Feddeler et al. |
| 2010/0283645 | A1 | 11/2010 | Haneda |
| 2012/0112938 | A1 | 5/2012 | Haneda |
| 2012/0194364 | A1 | 8/2012 | Chio et al. |
| 2013/0265181 | A1 | 10/2013 | Haneda |

FOREIGN PATENT DOCUMENTS

| JP | A-08-321779 | 12/1996 |
| JP | A-2010-263399 | 11/2010 |
| JP | 2012-104938 A | 5/2012 |

* cited by examiner

*Primary Examiner* — Peguy Jean Pierre
(74) *Attorney, Agent, or Firm* — Oliff PLC

(57) ABSTRACT

An A/D converter circuit includes a comparison circuit that performs a process to compare an added signal of a sampled signal of an input signal and a code signal with a D/A output signal, or a process to compare the sampled signal with an added signal of the D/A output signal and the code signal, a control circuit that outputs output data obtained based on successive approximation result data and the code data as A/D conversion data of the input signal, a first D/A converter circuit that D/A converts the data for successive approximation, a second D/A converter circuit that D/A converts code data that changes over time, and a correction section that performs a correction process, to correct the successive approximation result data so as not to overflow due to code shifting using the code data.

15 Claims, 19 Drawing Sheets

A/D CONVERTER CIRCUIT, ELECTRONIC APPARATUS AND A/D CONVERSION METHOD

This is a Continuation of application Ser. No. 13/267,289 filed Oct. 6, 2011, which claims priority to JP 2010-249949 filed Nov. 8, 2010. The disclosure of the prior application is hereby incorporated by reference herein in its entirety.

BACKGROUND

1. Technical Field

The present invention relates to A/D converter circuits, electronic apparatuses, and A/D conversion methods.

2. Related Art

As an A/D converter circuit that converts an analog signal to digital data, a successive approximation A/D converter circuit is known. The successive approximation A/D converter circuit is typically equipped with a comparison circuit, a successive approximation register, and a D/A converter circuit, and performs analog-to-digital conversion of a sampled signal (a sampled and held signal) of an input signal by the successive approximation operation to thereby output digital data. As one of the common implementations of the successive approximation A/D converter circuit, the technology described in Japanese Laid-open Patent Application HEI 08-321779 (Patent Document 1) is known.

The conversion accuracy of such an A/D converter circuit mostly depends on the accuracy of the D/A converter circuit. When increasing the accuracy of the D/A converter circuit, the area of the capacitors (in the case of a charge-redistribution type) or the area of the resistances (in the case of a ladder resistance type) may be increased. This causes the circuit to become larger in scale. On the other hand, in order to suppress an increase in the circuit scale, some measures may be added to the circuit of the D/A converter circuit. However, this may lead to problems, such as, generation of missing codes, due to errors of differential nonlinearity (DNL), integral nonlinearity (INL) and the like.

The A/D conversion characteristic such as DNL and INL may be improved, but such improvement may reduce the dynamic range in A/D conversion. This is not desirable for the performance required for A/D conversion.

SUMMARY

In accordance with an advantage of some aspects of the invention, it is possible to provide A/D converter circuits, electronic apparatuses and A/D conversion methods that can improve the A/D conversion characteristic and can inhibit a reduction in the dynamic range.

In accordance with an embodiment of the invention, an A/D converter circuit includes: a comparison circuit; a control circuit that has a successive approximation register with a register value set by a comparison result signal from the comparison circuit, and outputs data for successive approximation; a first D/A converter circuit that D/A converts the data for successive approximation from the control circuit, and outputs a D/A output signal corresponding to the data for successive approximation; a second D/A converter circuit that D/A converts code data that changes over time, and outputs a code signal corresponding to the code data; and a correction section that performs a correction process. The comparison circuit performs a process to compare an added signal of a sampled signal of an input signal and the code signal with the D/A output signal, or a process to compare the sampled signal with an added signal of the D/A output signal and the code signal. The control circuit outputs output data obtained based on successive approximation result data of the successive approximation register and the code data as A/D conversion data of the input signal. The correction section performs a correction process to correct the successive approximation result data so as not to overflow due to code shifting using the code data.

According to the aspect of the embodiment described above, data for successive approximation from the control circuit having a successive approximation register is inputted in the first D/A converter circuit which then outputs a D/A output signal corresponding to the data for successive approximation. Code data that changes over time is inputted in the second D/A converter circuit which then outputs a code signal corresponding to the code data. Then, a process to compare an added signal of a sampled signal of an input signal and the code signal with the D/A output signal, or a process to compare the sampled signal with an added signal of the D/A output signal and the code signal is performed. Then, output data obtained based on successive approximation result data and the code data is outputted as A/D conversion data of the input signal. According to the above aspect, code shifting using the code data that change over time is performed, whereby the A/D conversion characteristic can be improved.

According to the aspect of the embodiment of the invention, overflow of successive approximation result data that may be caused by the code shifting using the code data can be inhibited by the correction process. Accordingly, while the A/D conversion characteristic can be improved by the code shifting, a reduction in the dynamic range that may be caused by the code shifting can be inhibited.

In accordance with an aspect of the embodiment of the invention, when the minimum resolution of the first D/A converter circuit is RS1, and the minimum resolution of the second D/A converter circuit is RS2, RS1 and RS2 may have a relation of RS2≥RS1.

As a result, the code shifting can be realized through performing the process of adding a code signal greater than the minimum resolution RS1 of the first D/A converter circuit.

In accordance with an aspect of the embodiment of the invention, the correction section may perform the correction process through correcting the code data.

According to this aspect, the correction process that inhibits a reduction in the dynamic range caused by code shifting can be realized by a simple processing of correcting code data.

Also, in accordance with another aspect of the embodiment of the invention, the correction section may perform the correction process through correcting the data code based on last successive approximation result data that is successive approximation result data in the last A/D conversion.

According to the aspect described above, successive approximation result data in the last A/D conversion is used to predict as to whether or not successive approximation result data in the current A/D conversion would overflow, which makes it possible to realize a correction process that can inhibit a reduction in the dynamic range that may be caused by code shifting.

In accordance with another aspect of the embodiment of the invention, when the last successive approximation result data is data corresponding to a first range on a high potential side of an A/D input voltage range, the correction section may perform the correction process of the code data such that the successive approximation result data in the current A/D conversion shifts to a low potential side, and when the last successive approximation result data is data corresponding to a second range on a low potential side of the A/D input voltage range, the correction section may perform the correction process of the code data such that the successive approximation result data in the current A/D conversion shifts to a high potential side.

According to this aspect, when the last successive approximation result data is data in the first range on a high potential side, the code data is corrected such that the successive approximation result data shifts to a low potential side, whereby a reduction in the dynamic range due to code shifting can be inhibited. On the other hand, when the last successive approximation result data is data in the second range on a low potential side, the code data is corrected such that the successive approximation result data shifts to a high potential side, whereby a reduction in the dynamic range due to code shifting can be inhibited.

Further, in accordance with an aspect of the embodiment of the invention, the A/D converter circuit may include a code data generation section that generates the code data and outputs the code data to the second D/A converter circuit. When the last successive approximation result data is data in a third range between the first range and the second range, the code data generation section may generate the code data that alternately becomes positive and negative, and output the code data to the second D/A converter circuit.

As the code data alternately becomes positive and negative, influence of frequency components due to changes in the code data can be reduced, and adverse effects on the A/D conversion characteristic can be inhibited.

In accordance with an aspect of the embodiment of the invention, the correction section may include an information register that stores information indicative of whether the last successive approximation result data is data corresponding to the first range or the second range.

According to this aspect, based on information stored in the information register, a judgment is made as to whether the last successive approximation result data is data corresponding to the first range or the second range, whereby the code data in the current A/D conversion can be corrected.

In accordance with another aspect of the embodiment of the invention, when a signal with a plurality of channels is A/D converted by time division, the information register may store the information as to whether or not the last successive approximation result data is data corresponding to the first range or the second range for each of the plurality of channels.

According to the aspect described above, even when a signal with a plurality of channels is A/D converted, a judgment is made based on information stored in the information register as to whether the last successive approximation result data of each of the plurality of channels is data corresponding to the first range or the second range, such that the code data for each of the channels can be corrected.

In accordance with an aspect of the invention, the A/D converter circuit may include a code data generation section that generates the code data and outputs the code data to the second D/A converter circuit. The code data generation section may output data with a value that becomes different at each timing or each plurality of timings of A/D conversion within a predetermined data range.

According to this aspect, the process of adding a code signal corresponding to code data that becomes different at each timing or each plurality of timings of A/D conversion is performed, thereby realizing the code shifting. Accordingly, for example, deterioration of the DNL characteristic can be temporally diffused into neighboring codes such that the A/D conversion characteristic can be improved.

In accordance with another aspect of the embodiment of the invention, the code data generation section may output a prime number sets of code data when A/D conversion is performed with a power of two times oversampling.

According to this aspect, the A/D conversion characteristic can be improved by the synergetic effect of the oversampling and the code shifting.

In accordance with another aspect of the embodiment of the invention, the first D/A converter circuit and the second D/A converter circuit may be charge-redistribution type D/A converter circuits.

It is noted that a part or all of the first and second D/A converter circuits may be realized by a ladder resistance type D/A converter circuit.

In accordance with an aspect of the embodiment of the invention, the first D/A converter circuit may include a first capacity array section having a plurality of capacitors with one ends connected to a comparison node of the comparison circuit, a first switch array section having a plurality of switching elements that are connected to other ends of the plurality of capacitors of the first capacitor array section and switch-controlled based on higher bit data of the data for successive approximation, a first series capacitor provided between the comparison node and a first node, a second capacitor array section having a plurality of capacitors with one end connected to the first node, and a second switch array section having a plurality of switching elements that are connected to other ends of the plurality of capacitors of the second capacitor array section and switch-controlled based on lower bit data of the data for successive approximation. Further, the second D/A converter circuit may include a second series capacitor provided between the comparison node and a second node, a third capacitor array section having a plurality of capacitors with one ends connected to the second node, and a third switch array section having a plurality of switching elements that are connected to other ends of the plurality of capacitors of the third capacitor array section and are switch-controlled based on the code data.

By using the first D/A converter circuit thus configured, A/D conversion with a higher bit rate can be achieved while an increase in the circuit area can be suppressed to the minimum. Also, by using the second D/A converter circuit thus configured, the process to compare a sampled signal with an added signal of the D/A output signal and the code signal can be realized.

Further, in accordance with another aspect of the embodiment of the invention, the control circuit may perform a process of subtracting the code data from the successive approximation result data of the successive approximation register, when the process of comparing an added signal of the sampled signal and the code signal with the D/A output signal is performed.

According to this aspect, by performing the process of subtracting the code data when the process of comparing an added signal of the sampled signal and the code signal with the D/A output signal is performed, appropriate A/D conversion data can be outputted.

Also, in accordance with another aspect of the embodiment of the invention, the control circuit may perform a process of adding the code data to the successive approximation result data of the successive approximation register, when the process of comparing the sampled signal with an added signal of the D/A output signal and the code signal is performed.

According to this aspect, by performing the process of adding the code data when the process of comparing a sampled signal with an added signal of the D/A output signal and the code signal is performed, appropriate A/D conversion data can be outputted.

In accordance with another embodiment of the invention, an electronic apparatus includes any one of the A/D converter circuits recited above.

Still another embodiment of the invention pertains to an A/D conversion method implemented in a successive approximation type A/D converter circuit having a comparison circuit, a successive approximation register and a D/A converter circuit. The A/D conversion method includes: generating a code signal corresponding to code data that changes over time; performing a process of comparing an added signal of a sampled signal of an input signal and the code signal with a D/A output signal from the D/A converter circuit, or a process to compare the sampled signal with an added signal of the D/A output signal and the code signal; outputting output data obtained based on successive approximation result data of the successive approximation register and the code data as A/D conversion data of the input signal; and performing a correction process to correct the successive approximation result data so as not to overflow due to code shifting using the code data.

According to the aspect of the embodiment of the invention, a code signal corresponding to code data is generated, and a process of comparing an added signal of a sampled signal of an input signal and the code signal with a D/A output signal, or a process to compare the sampled signal with an added signal of the D/A output signal and the code signal is performed. Then, output data obtained based on successive approximation result data and the code data is outputted as A/D conversion data of the input signal. As a result, code shifting is performed with code data that changes over time, such that the A/D conversion characteristic can be improved.

In accordance with another aspect of the embodiment of the invention, overflow of successive approximation result data occurring due to code shifting that use such code data can be inhibited by a correction process. Accordingly, while the A/D conversion characteristic can be improved by code shifting, a reduction in the dynamic range due to the code shifting can be inhibited.

DESCRIPTION OF EXEMPLARY EMBODIMENTS

Preferred embodiments of the invention will be described below in detail. It is noted that the embodiments described below will not unduly limit the contents of the invention recited in claims, and all of the configurations to be described in the embodiments would not necessarily be indispensable as the means for solution provided by the invention.

1. Configuration

Figure 1:
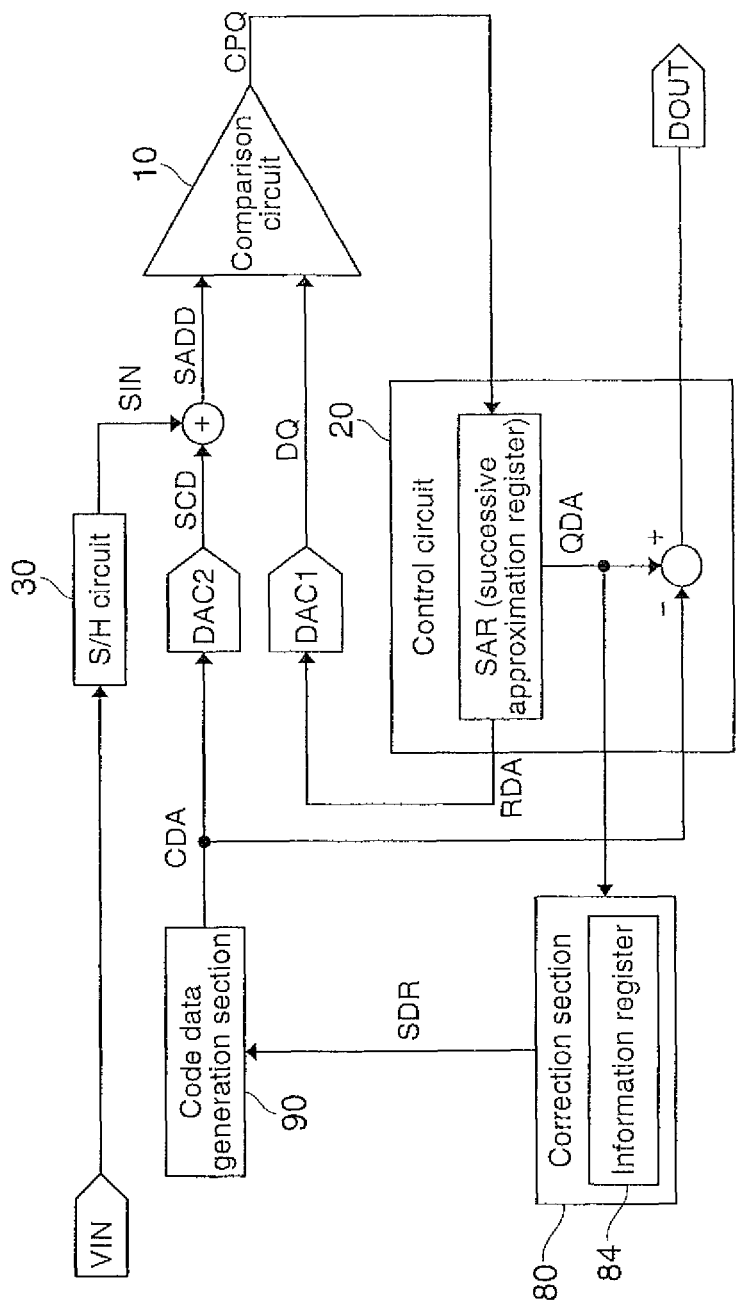
FIG. 1 shows an exemplary configuration of an A/D converter circuit in accordance with an embodiment of the invention.

FIG. 1 shows an exemplary configuration of an A/D converter circuit in accordance with an embodiment of the invention. The A/D converter circuit includes a comparison circuit 10, a control circuit 20, a first D/A converter circuit DAC1, a second D/A converter circuit DAC2 and a correction section 80. The A/D converter circuit may also be provided with a sample and hold (S/H) circuit 30 and a code data generation section 90.

It is noted that the A/D converter circuit of the present embodiment is not limited to the configuration shown in FIG. 1, but various modifications, such as, omission of a part of the components, addition of other components and the like may be implemented. For example, a component, for example, the S/H circuit 30, may be omitted, and the D/A converter circuit may be provided with the sample and hold function for an input signal VIN. Also, a component, for example, the code data generation section 90 may be omitted, and code data may be directly inputted from outside.

The comparison circuit 10 is realized by a comparator (for example, a latch type comparator), and performs a process of comparing, for example, a signal SADD and a signal DQ.

The control circuit 20 includes a successive approximation register SAR, and outputs data for successive approximation RDA (D/A input data). The successive approximation register SAR is a register whose register value is set by a comparison result signal CPA provided from the comparison circuit 10. For example, when the comparison circuit 10 performs a successive approximation process for bits ranging from the MSB to the LSB, comparison process results ("1," "0") at the respective bits are stored as register values of the successive approximation register SAR.

It is noted that the control circuit 20 may also perform a process of controlling each circuit block included in the A/D converter circuit. For example, the control circuit 20 may perform ON/OFF control of switching elements (of a switch array) included in the D/A converter circuits DAC1 and DAC2.

The D/A converter circuit DAC1 performs digital-to-analog (D/A) conversion of data for successive approximation RDA from the control circuit 20. The D/A converter circuit DAC1 then outputs a D/A output signal DQ corresponding to the data for successive approximation RDA (which is an analog signal of D/A converted RDA). The D/A converter circuit DAC1 may be of a charge-redistribution type using a capacitor array, or may be a ladder resistance type in part or in the entirety.

The D/A converter circuit DAC2 performs D/A conversion of code data CDA, and outputs a code signal SCD corresponding to the code data CDA (which is a signal of D/A converted CDA). It is noted that the code data CDA is data that changes over time (digital data that changes at predetermined timings). More specifically, the code data CDA is data that becomes to be a value different at each timing or each plurality of timings of A/D conversion within a predetermined data range.

It is noted that the data range in this case is a range with first digital data as the upper limit value and second digital data as the lower limit value. The A/D conversion timing may be, for example, a timing corresponding to each A/D conversion period in which digital data is converted to an analog signal.

The S/H (sample and hold) circuit 30 is a circuit that samples and holds an input signal VIN that is subjected to A/D conversion. In the case of a charge-redistribution type, the function of the S/H circuit 30 may be realized by the D/A converter circuit.

The code data generation section 90 generates code data CDA and outputs the same to the D/A converter circuit DAC2. For example, the code data generation section 90 outputs code data CDA that assumes a value different at each timing or each plurality of timings of A/D conversion within a predetermined data range. More specifically, the code data generation section 90 outputs code data CDA that assumes a value different at each timing or each plurality of timings of A/D conversion within the data range of data of lower bits of the data for successive approximation.

The correction section 80 performs a correction process. More specifically, the correction section 80 performs a correction process for preventing a reduction in the dynamic range which may occur due to code shifting using the code data CDA. The correction section 80 has an information register 84.

The comparison circuit 10 in accordance with the present embodiment performs a process of comparing an added signal SADD of a sampled signal SIN of an input signal VIN (which is the VIN that is sampled and held) and a code signal SCD with a D/A output signal DQ. More specifically, the comparison circuit 10 compares the added signal SADD (an added voltage) inputted in a first input terminal thereof with the D/A output signal DQ (D/A converted voltage) inputted in a second input terminal thereof. In the case of a charge-redistribution type, the comparison circuit 10 performs a process of comparing the sampled signal SIN with an added signal of the D/A output signal DQ and the code signal SCD. For example, a sampled voltage of the signal SIN is compared with an added voltage of the signals DQ and SCD.

Then the control circuit 20 outputs output data DOUT obtained based on successive approximation result data QDA (final data) from the successive approximation register SAR and the code data CDA as A/D conversion data of the input signal VIN. For example, when the process of comparing the added signal SADD of the sampled signal SIN and the code signal SCD with the D/A output signal DQ is performed, as shown in FIG. 1, the control circuit 20 performs a process of subtracting the code data CDA from the successive approximation result data QD of the successive approximation register SAR. On the other hand, if the process of comparing the sampled signal SIN with an added signal of the D/A output signal DQ and the code signal SCD is performed, as in the case of a charge-redistribution type to be described below, a process of adding the code data CDA to the successive approximation result data QD is performed.

Also, the correction section 80 performs a correction process to correct (prevent) successive approximation result data QDA from overflowing due to code shifting using the code data CDA. Here, the code shifting with the code data means a process of adding a sampled signal of an input signal and a code signal, or a process of adding a D/A output signal and a code signal, whereby the successive approximation result data shifts from data corresponding to the input signal to a higher potential side or to a lower potential side.

For example, the correction section 80 corrects the code data CDA, thereby performing the correction process. Then, the correction section 80 outputs a correction instruction signal SDR to the code data generation section 90. More specifically, the correction section 80 corrects the code data CDA (the current code data) based on last successive approximation result data that is successive approximation result data obtained in the last A/D conversion, thereby performing the correction process. It is noted that the correction process of the present embodiment is not limited to the process of correcting the code data CDA, but many modifications can be made as long as overflowing of successive approximation result data QDA can be corrected. Also, in addition to the process using the last successive approximation result data, the correction process may be performed by judging the signs of the code data CDA and the like.

The code shifting method in accordance with the present embodiment will be described with reference to an example in which the bit number in A/D conversion is 8 bits.

First, the S/H circuit 30 samples and holds an input signal VIN and outputs a sampled signal SIN. The code data generation section 90 outputs arbitrary code data CDA within a predetermined data range (for example, 0000-1111), and the D/A converter circuit DAC2 outputs a code signal SCD corresponding to the CDA.

The control circuit 20 outputs data for successive approximation RDA with the MSB set as "1" for example (RDA=10000000), and the D/A converter circuit DAC1 outputs a D/A output signal DQ corresponding to RDA.

The comparison circuit 10 compares the voltage of a signal SADD that is obtained by addition of the sampled signal SIN and the code signal SCD with the voltage of the D/A output signal DQ, and outputs a comparison result signal CPQ that is "1" or "0." For example, "1" is outputted when the voltage of the signal DQ is greater than the voltage of the signal SADD, and "0" is outputted when it is smaller. By this, "1" or "0" is set as a bit at the MSB of the register value of the successive approximation register SAR.

Then, the control circuit 20 outputs data for successive approximation RDA in which a bit next to the MSB is set at "1" (i.e., RDA=11000000 or 01000000). For example, when the comparison result of the MSB is "1," RDA=11000000 is outputted; and when it is "0," RDA=01000000 is outputted. Then the D/A converter circuit DAC1 outputs a D/A output signal DQ corresponding to the RDA.

Then, the comparison circuit 10 compares the voltage of a signal SADD obtained by adding the sampled signal SIN to the code signal SCD with the voltage of the D/A output signal DQ, and outputs a comparison result signal CPQ of "1" or "0." By this, "1" or "0" is set at the bit next to the MSB of the register value of the successive approximation register SAR.

The successive approximation operation described above is repeatedly executed for bits from the MSB to the LSB, whereby final successive approximation result data QDA is obtained. In other words, by executing the successive approximation operation such that the voltage of the input signal VIN and the voltage of the D/A output signal DQ become equal to each other, the final successive approximation result data QDA is obtained. Then, data obtained by subtracting the code data CDA from the obtained successive approximation result data QDA is outputted as data DOUT that is an A/D converted input signal VIN.

Figure 2:
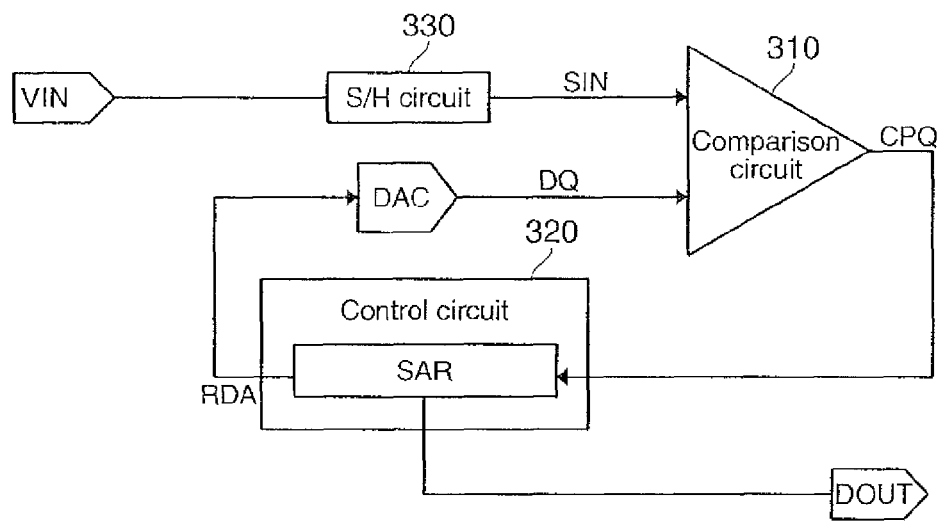
FIG. 2 shows a first comparison example of an A/D converter circuit.
Figure 3:
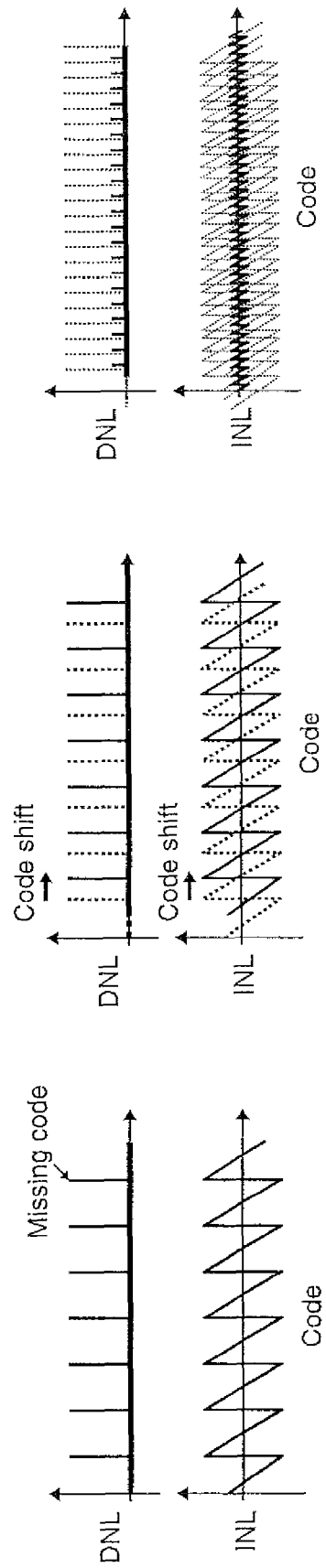
FIGS. 3A, 3B and 3C are diagrams for explaining a code shifting method in accordance with an embodiment of the invention.

FIG. 2 shows a first comparison example of an A/D converter circuit to be compared with the present embodiment. The first comparison example is not provided with the code data generation section 90 and the second D/A converter circuit DAC2. Further, in the first comparison example, missing codes occur at specified codes due to, for example, DNL errors, as shown in FIG. 3A. For example, if DNL exceeds 1 LSB, the missing code phenomenon in which a code with an output code missing occurs.

In this respect, in accordance with the present embodiment, the signal SCD of the code data CDA that changes over time is added to the sampled signal SIN, such that, even when such a missing code occurs, code shifting as shown in FIG. 3B is performed. A solid line in FIG. 3B represents the characteristic after code shifting, and a broken line represents the characteristic before code shifting.

In other words, in accordance with the present embodiment, the code data CDA is changed to a different value at each timing or each plurality of timings of A/D conversion, such that the location of a code at which a missing code occurs changes at each timing or each plurality of timings of A/D conversion. For example, even though a missing code is generated at a code 00010000, that location shifts to other locations such as 00010001, 00010010, 00001111 and the like. As a result, over a long time range, DNL and INL are improved as shown in FIG. 3C, whereby good characteristic can be obtained without having the missing code phenomenon taking place. In other words, deterioration of the DNL characteristic (a missing code) that occurs at a specific code is diffused into surrounding codes by the code data CDA that changes over time, such that the characteristic can be improved.

Let us examine a case where an offset voltage is applied on purpose to an input voltage, in a state in which a missing code is occurring, as shown in FIG. 3A. The DNL and INL characteristics at this moment would appear as if they had shifted by a code corresponding to the applied offset voltage. In this case, as the digital data that is converted by the A/D converter circuit has been added with a code corresponding to an offset voltage, a final result can be obtained by subtracting the code corresponding to the offset voltage therefrom. The code shifting method in accordance with the present embodiment uses this characteristic, and an offset voltage that differs each time is added to an input voltage. By so doing, conversion is apparently performed by the A/D converter circuit having the characteristic shown in FIG. 3C.

For example, let us examine a case where a voltage corresponding to a code at which a missing code is occurring is A/D converted. When code shifting is not performed, nonlinear conversion would be performed around the input voltage. In contrast, when code shifting by a certain value is performed, conversion with good linearity would be performed around the input voltage. In other words, by performing code shifting with a variety of values, nonlinear conversion may take place at a certain value of code shifting, but linear conversion would be performed at most of the other values of code shifting. Eventually, by performing code shifting, relatively linear conversion is performed even at an input voltage at which a missing code is essentially occurring.

As described above, in accordance with the present embodiment, by performing a simple process of generating and adding code data CDA, generation of missing codes can be prevented, and the DNL and INL characteristic of the A/D converter circuit is successfully improved.

2. Correction Process

It becomes clear that the code shifting method described above has a problem in that the dynamic range is reduced. In other words, if an offset voltage by code shifting is applied at the moment of an input voltage near the dynamic range limit, data to be actually A/D converted exceeds the dynamic range, whereby the dynamic range is effectively reduced.

In order to avoid such a problem, in accordance with the present embodiment, for example, the last converted value may be stored; and when the dynamic range would likely be exceeded due to code shifting, code data that would not cause the dynamic range to be exceeded is generated based on the stored converted value. Then, the generated code data is inputted in the D/A converter circuit DAC2 for code shifting, whereby deterioration of the dynamic range is avoided.

Figure 4:
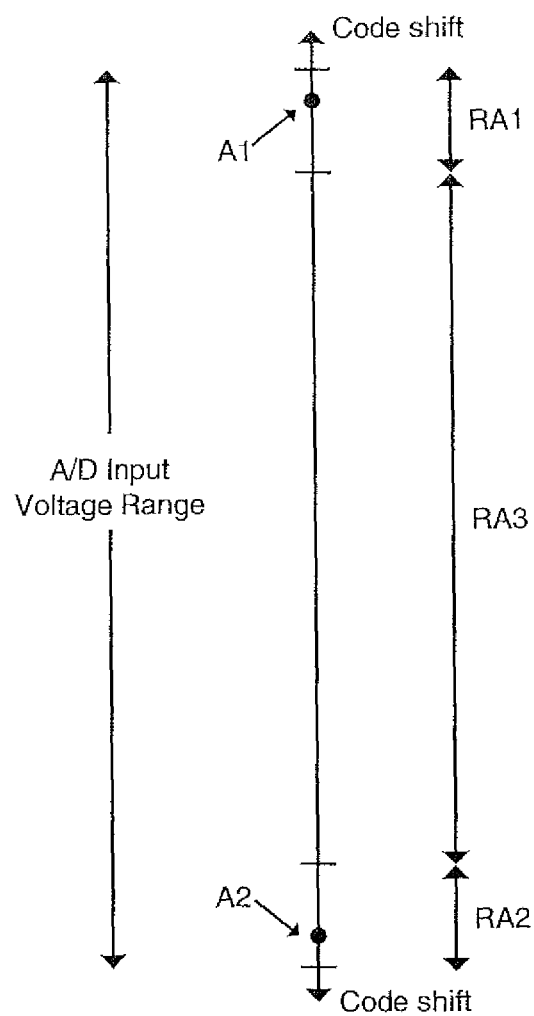
FIG. 4 is a diagram for explaining a problem of reduction in the dynamic range due to code shifting.

For example, as shown in FIG. 4, A/D Input Voltage Range represents the dynamic range of the A/D converter circuit, and the A/D converter circuit is capable of properly A/D converting input voltages within this A/D Input Voltage Range.

When an input voltage is in a first range RA1 on a higher potential side of the A/D Input Voltage Range, if code shifting is performed in a direction toward the higher potential side (a positive direction), the dynamic range is exceeded, such that the dynamic range is effectively reduced. Similarly, when an input voltage is in a second range RA2 on a lower potential side of the A/D Input Voltage Range, if code shifting is performed in a direction toward the lower potential side (a negative direction), the dynamic range is exceeded, such that the dynamic range is effectively reduced.

Figure 5:
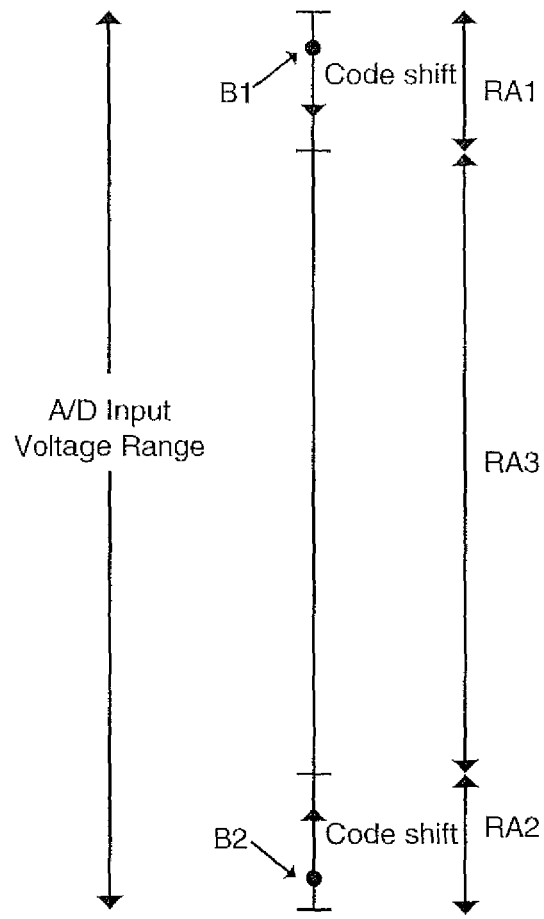
FIG. 5 is a diagram for explaining a correction method in accordance with an embodiment of the invention.

In order to solve the problem described above, in accordance with the present embodiment, when the input voltage is in the first range RA1 on the higher potential side, code data is corrected such that the result of A/D conversion shifts toward the lower potential side as indicated by B1 in FIG. 5. Also, when the input voltage is in the second range RA2 on the lower potential side, code data is corrected such that the result of A/D conversion shifts toward the higher potential side as indicated by B2. It is noted that the first range RA1 is a voltage range on the higher potential side including the maximum voltage (for example, the power supply voltage) in the A/D input voltage range, and the second range RA2 is a voltage range on the lower potential side including the minimum voltage (for example, 0V) in the A/D input voltage range. Further, the third voltage range RA3 is a voltage range (an intermediate voltage range) between the first range RA1 and the second range RA2.

For example, the correction section 80 in accordance with the present embodiment corrects code data based on last successive approximation result data that is successive approximation result data in the last A/D conversion.

Figure 6A:
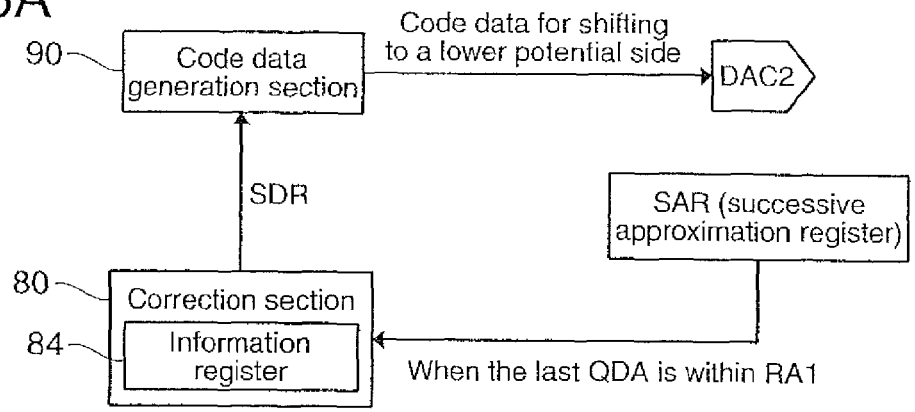
FIGS. 6A, 6B and 6C are diagrams for explaining a code data correction process in accordance with an embodiment of the invention.

More specifically, as shown in FIG. 6A, when the last successive approximation result data QDA is data corresponding to the first range RA1 on the higher potential side of the A/D input voltage range, the correction section 80 corrects the code data CDA such that successive approximation result data QDA in the current A/D conversion shifts to the lower potential side. For example, when the last successive approximation result data QDA is data within the first range RA1, and the direction of code shifting is in the direction toward the higher potential side (a positive direction) as indicated by A1 in FIG. 4, the code data generation section 90 corrects code data CDA according to a correction instruction signal SDR from the correction section 80 such that the successive approximation result data QDA shifts in a direction toward the lower potential side, as indicated by B1 in FIG. 5, and outputs the corrected code data to the second D/A converter circuit DAC2 for code shifting.

Figure 6B:
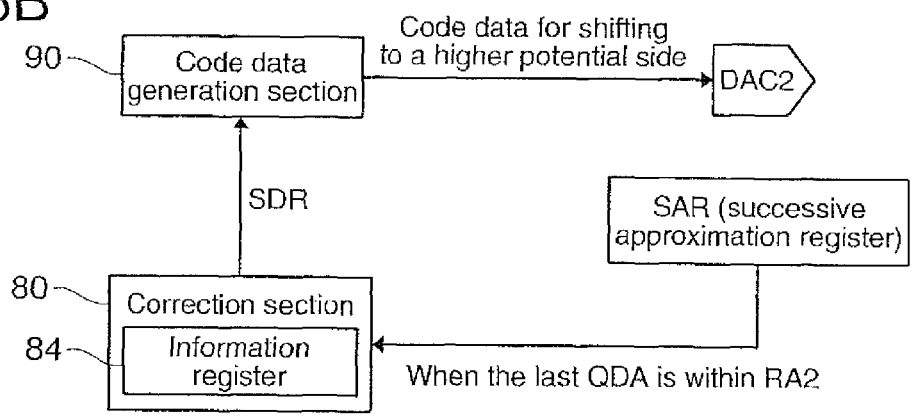
Figure 6C:
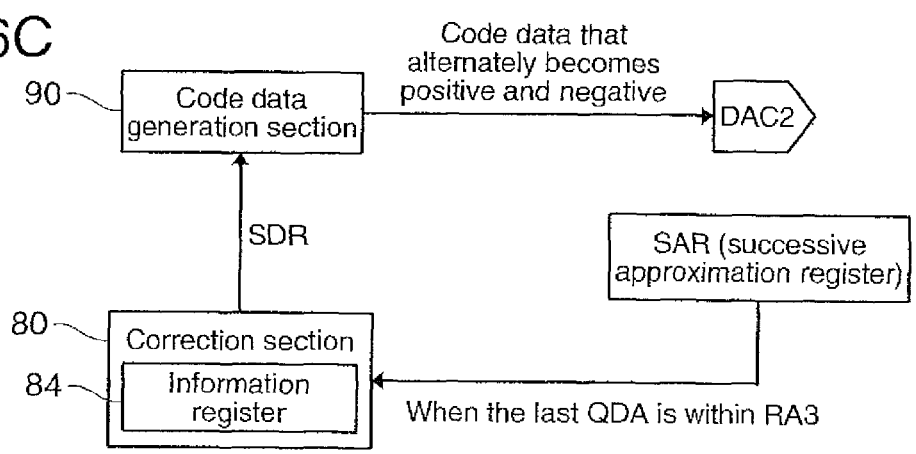

Further, as shown in FIG. 6B, when the last successive approximation result data QDA is data corresponding to the second range RA2 on the lower potential side of the A/D input voltage range, the correction section 80 corrects the code data CDA such that successive approximation result data QDA in the current A/D conversion shifts to the higher potential side. For example, when the last successive approximation result data QDA is data within the second range RA2, and the direction of code shifting is in the direction toward the lower potential side (a negative direction) as indicated by A2 in FIG. 4, the code data generation section 90 corrects code data CDA according to a correction instruction signal SDR from the correction section 80 such that the successive approximation result data QDA shifts in a direction toward the higher potential side, as indicated by B2 in FIG. 5, and outputs the corrected code data to the second D/A converter circuit DAC2.

When the last successive approximation result data QDA is data corresponding to the third range RA3 between the first range RA1 and the second range RA2 shown in FIG. 5, the code data generation section 90 generates code data that alternately becomes positive and negative, and outputs the code data to the second D/A converter circuit DAC2.

The correction section 80 includes an information register 84 that stores information as to whether the last successive approximation result data QDA is data corresponding to the first range RA1 or the second RA2. It is noted that, when a signal with a plurality of channels is A/D converted through time division, the information register 84 stores information for each of the plurality of channels as to whether the last successive approximation result data is data corresponding to the first range RA1 or the second range RA2.

More specifically, the correction section 80 judges as to whether the successive approximation result data QDA in the last A/D conversion is data in the first range RA1 and the direction of code shifting is in a direction to the higher potential side, or whether the successive approximation result data QDA in the last A/D conversion is data in the second range RA2 and the direction of code shifting is in a direction to the lower potential side. The judgment result information is stored in the information register 84. Then, the correction section 80 generates a correction instruction signal SDR based on the stored judgment result information, and outputs the correction instruction signal SDR to the code data generation section 90, to instruct to correct the code data CDA. By this, the code data generation section 90 corrects the code data CDA in the current A/D conversion, and outputs the same to the second D/A converter circuit DAC2.

3. Correction Section and Code Data Generation Section

Figure 7:
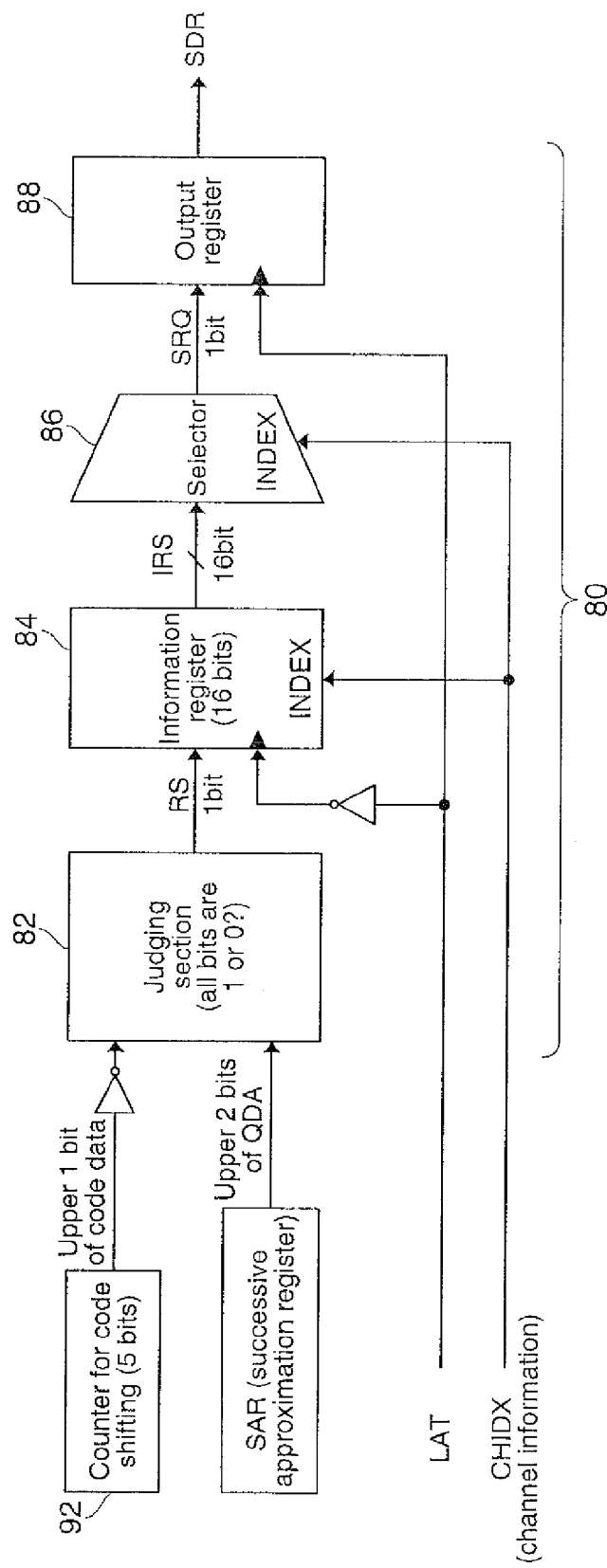
FIG. 7 shows an exemplary configuration of the correction section.
Figure 8:
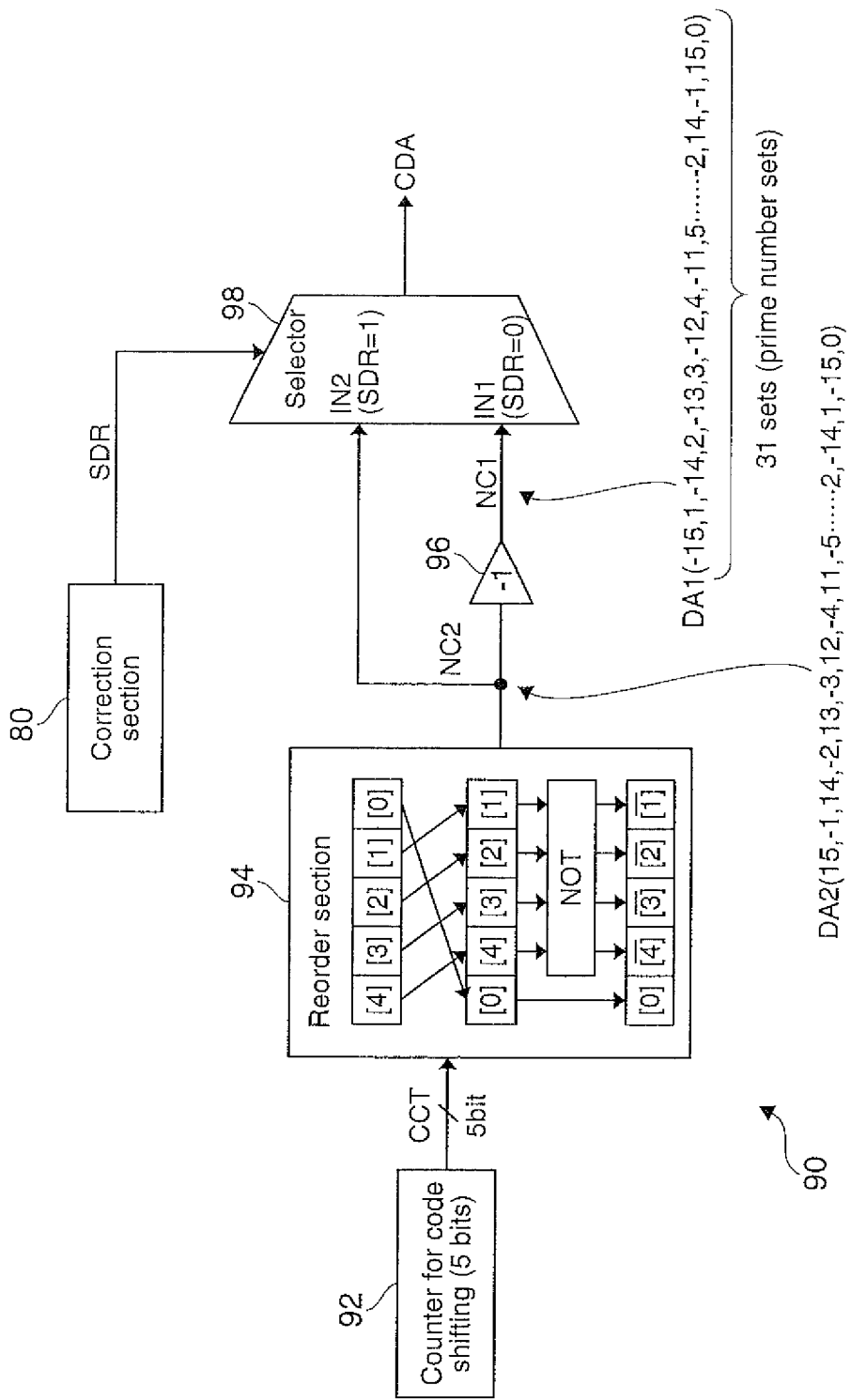
FIG. 8 shows an exemplary configuration of a code data generation section.

FIG. 7 and FIG. 8 shows exemplary configurations of the correction section 80 and the code data generation section 90. It is noted that the correction section 80 and the code data generation section 90 are not limited to the configurations shown in FIG. 7 and FIG. 8, and various changes, such as, omission of a portion of the components, addition of other components and the like can be implemented.

The correction section 80 includes a judging section 82, an information register 84, a selector 86 and an output register 88.

The judging section 82 receives an inverted sign bit that is an inverted upper 1 bit of the sign bit of code data from a code shift counter 92, and also receives upper two bits of successive approximation result data QDA from the successive approximation register SAR. The code shift counter 92 is a 5-bit counter, and outputs code data of 5 bits in two's complement. Accordingly, the upper one bit of the code data is the sing bit. Also, the upper two bits of the successive approximation result data QDA from the successive approximation register SAR are the MSB and the bit next to the MSB.

The judging section 82 judges as to whether all of the three bits composed of the inverted sign bit of the code data and the upper two bits of the successive approximation result data QDA are "1" or "0," and outputs a judging result signal RS=1 when all of them are "1" or "0."

Here, the upper one bit of the code data being "1" means that the sign of the code data is positive, and "0" means that the sign is negative. As described below, the code data alternately becomes positive and negative at each A/D conversion. Therefore, when the inverted sign bit inputted in the judging section 82 is "1," the sign of code data in the last A/D conversion is negative, meaning that the sign of the code data in the current A/D conversion becomes positive. Also, when the inverted sign bit is "0," the sign of code data in the last A/D conversion is positive, meaning that the sign of the code data in the current A/D conversion becomes negative.

Also, the upper two bits of the successive approximation result data QDA being "11" means that the QDA is data corresponding to the first range RA1 in FIG. 5, and the upper two bits being "00" means that the QDA is data corresponding to the second range RA2.

Then, when the three bits composed of the inverted sign bit of the code data and the upper two bits of the successive approximation result data QDA are "111" or "000," the judging result signal RS becomes 1 (RS=1). Accordingly, the judging result signal RS=1 means that the successive approximation result data QDA in the last A/D conversion was within the first range RA1 and the sign of the current code data is positive (the shift direction is in a direction to the higher potential side), or the QDA was within the second range RA2 and the sign of the current code data is negative (the shift direction is in a direction to the lower potential side).

Figure 9:
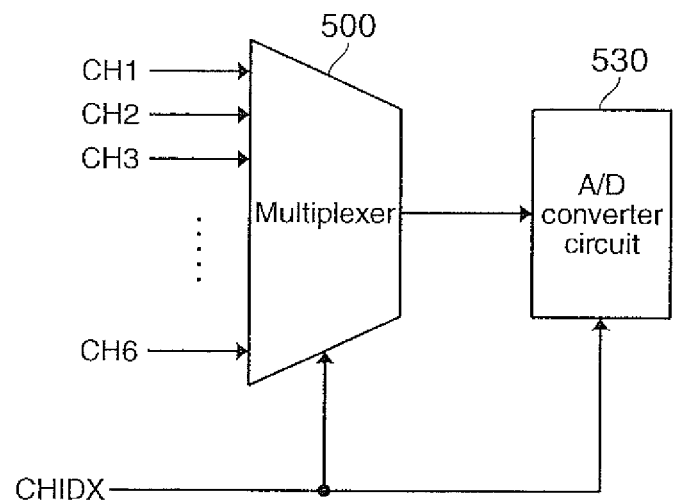
FIG. 9 is a diagram for explaining a method of A/D converting a signal with a plurality of channels by time division.

The information register 84 receives the judging result signal RS from the judging section 82 and stores the same. As shown in FIG. 9, in accordance with the present embodiment, an A/D converter circuit 530 performs A/D conversion of a signal with multiple channels CH1-CH16 by time-division. More specifically, a multiplexer 500 is provided in the preceding stage of the A/D converter circuit 530. The multiplexer 500 selects a signal of one channel among the multiple channels CH1-CH16 based on a channel selection index signal CHIDX. Then, the A/D converter circuit 530 A/D converts the signal (voltage) of the selected channel. As the index signal CHIDX sequentially instructs to select a channel CH1, CH2, CH3, . . . , and CH16 in this order, the A/D converter circuit 530 A/D converts the signal of each of the channels CH1, CH2, CH3, . . . , and CH16 in this order.

The information register 84 is a 16-bit (N-bit in a broad sense) register corresponding to 16 channels (N channels in a broad sense) of the CH1-CH16. The information register 84 receives the channel selection index signal CHIDX described above and the 1-bit judging result signal RS. Then, among the 16 bits of the judging result information IRS, one bit corresponding to the channel that is currently being A/D converted is set at the value of the judging result signal RS. For example, when the judging result signal RS is "1," the corresponding bit of the judging result information IRS is set at "1." When the RS is "0," the corresponding bit of the IRS is set at "0." For example, for the channel CH1, when the successive approximation result data QDA is within the first range RA1 and the sign of the code data is positive (or within RA2 and the sign is negative), and QDA for the other channels CH2-CH16 is within the third range RA3, the judging result information IRS is set as "1000000000000000."

The selector 86 receives the judging result information IRS from the information register 84. Then the selector 86 outputs the value of one bit among the 16 bits of the judging result information IRS corresponding to the channel designated by the channel selection index signal CHIDX as a 1-bit signal SRQ. For example, when the judging result information IRS is "1000000000000000" as described above, and the index signal CHIDX designates the channel CH1, the selector 86 outputs the signal SRQ=1. On the other hand, when the index signal CHIDX designates one of the other channels CH2-CH16, the selector 86 outputs the signal SRQ=0.

The output register 88 latches the signal SRQ from the selector 86, and outputs the latched signal to the code data generation section 90 as a correction instruction signal SDR at the timing of the next A/D conversion.

By so doing, when the successive approximation result data in the last A/D conversion is in the first range RA1 and the direction of code shifting in the current A/D conversion is in a direction to the higher potential side (i.e., the sign of the code data is positive), the correction instruction signal SDR in the current A/D is 1 (SDR=1). Similarly, when the successive approximation result data in the last A/D conversion is in the second range RA2 and the direction of code shifting in the current A/D conversion is in a direction to the lower potential side (i.e., the sign of the code data is negative), the correction instruction signal SDR in the current A/D is also 1 (SDR=1). On the other hand, when the successive approximation result data in the last A/D conversion is in the third range RA3, the correction instruction signal SDR in the current A/D conversion becomes to be 0 (SDR=0). Accordingly, by inverting the sign of the code data when the correction instruction signal SDR=1, overflowing due to the code shifting can be prevented.

As shown in FIG. 8, the code data generation section 90 includes a code shift counter 92, a reorder section 94, an inversion section 96 and a selector 98.

The code shift counter 92 is a 5-bit counter as described above. The code shift counter 92 generates a 5-bit count value CCT, and outputs the same to the reorder section 94. The reorder section 94 reorders the 5-bit count value CCT in binary digits, and sequentially outputs, to a node NC2, 31 sets of data (a prime number sets of data in a broad sense) DA2 ranging between −15 and +15, i.e., 15, −1, 14, −2, 13, −3, 12, −4, 11, −5, . . . 2, −14, 1, −15, 0. The inversion section 96 inverts the sign of the data DA2 at the node NC2, and sequentially outputs 31 sets of data DA1 ranging between −15 and +15, i.e., −15, 1, −14, 2, −13, 3, −12, 4, −11, 5, . . . −2, 14, −1, 15, 0.

The selector 98 selects one of the data DA1 and DA2 based on the correction instruction signal SDR from the correction section 80, and outputs the same as code data CDA. For example, when SDR=0, the data DA1 inputted in the terminal IN1 is selected, and outputted as code data CDA. When SDR=1, the data DA2 inputted in the terminal IN2 is selected, and outputted as code data CDA. The data DA2 becomes data that is the data DA1 with its sign being inverted. Accordingly, when the correction instruction signal SDR=1, a signal of the inverted DA1 is outputted as code data CDA.

For example, let us assume that the last successive approximation result data QDA is within the first range RA1, and the data DA1 is 14. In this case, if the data DA1=14 is selected as the current code data by the selector 98, overflow to the positive side in the dynamic range occurs as indicated by A1 shown in FIG. 4. Accordingly, in this case, the correction instruction signal SDR becomes 1 (SDR=1), and the selector 98 selects data DA2=−14, which is the data DA1=14 with its sign inverted. Therefore, DA2=−14 is outputted as code data CDA, whereby overflow to the positive side in the dynamic range is inhibited, as indicated by B1 in FIG. 5.

On the other hand, let us assume that the last successive approximation result data QDA is within the second range RA2, and the data DA1 is −15. In this case, if the data DA1=−15 is selected as the current code data, overflow to the negative side in the dynamic range occurs, as indicated by A2 shown in FIG. 4. Accordingly, in this case, the correction instruction signal SDR also becomes 1 (SDR=1), and the selector 98 selects data DA2=15, which is the data DA1=−15 with its sign inverted. Therefore, DA2=15 is outputted as code data CDA, whereby overflow to the negative side in the dynamic range is inhibited, as indicated by B2 in FIG. 5.

According to the present embodiment, overflow of successive approximation result data due to code shifting using code data is inhibited, such that a reduction in the dynamic range due to code shifting can be suppressed. Accordingly, while DNL and INL characteristics of the A/D converter circuit can be improved by code shifting, a reduction in the dynamic range resulting from code shifting can be inhibited.

When the last successive approximation result data QDA is within the third range RA3, the correction instruction signal SDR is 0 (SDR=0), data DA1 is selected by the selector 98, and code data that alternately becomes positive and negative is outputted. Because the code data CDA alternately becomes positive and negative, it is possible to suppress incidents in which frequency components (low frequency components) of changes in the code data CDA affect the A/D conversion characteristic. In other words, as the code data CDA alternately becomes positive and negative, frequency components of changes in the code data CDA shift to the higher frequency side. Such high frequency components can be cut by, for example, a digital filter (a low-pass filter) provided in the succeeding stage of the A/D converter circuit, such that influence of the frequency components of changes in the code data CDA can be reduced, and therefore adverse effects on the A/D conversion characteristic can be inhibited.

Also, when a method that compares an added signal of a sampled signal SIN of an input signal and a code signal SCD with a D/A output signal SCD is used, as in the example shown in FIG. 1, code data with a positive sign becomes data that shifts QDA in a direction to the higher potential side, and code data with a negative sign becomes data that shifts QDA in a direction to the lower potential side. However, when a method that compares a sampled signal SIN with an added signal of a D/A output signal DQ and a code signal SCD is used, code data with a positive sign becomes data that shifts QDA in a direction to the lower potential side, and code data with a negative sign becomes data that shifts QDA in a direction to the higher potential side.

4. Oversampling

In accordance with the present embodiment, A/D conversion is performed with a power of two times oversampling. For example, in the case of an example of 8-times oversampling, one final set of A/D output data is outputted each time one of eight A/D conversions AD1-AD8 is performed. In other words, the A/D converter circuit is operated with a wider bandwidth (faster frequency) than the bandwidth that is essentially necessary, and a digital filter is used in a succeeding stage of the A/D converter circuit to filter a necessary bandwidth to retrieve a signal. At this time, quantization noise outside the necessary bandwidth is removed by the digital filter, such that the signal to noise ratio (SNR) is improved. For example, when the oversampling ratio (OSR) is doubled, in theory, an effect of improving SNR by 3 dB (0.5 bit) can be obtained. Also, oversampling provides an advantage of reducing the order of stages of pre-filters in a preceding stage of the A/D converter circuit.

Figure 10A:
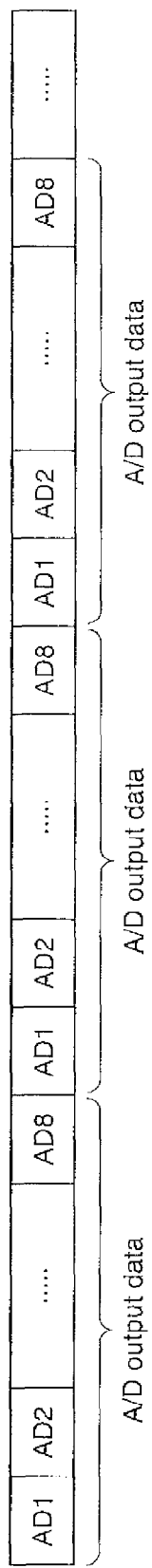
FIGS. 10A and 10B are diagrams for explaining a method of A/D conversion with oversampling, and a method of A/D conversion of a signal with a plurality of channels by time division.

However, when A/D conversion with such oversampling is performed, and when the period of changes in code data has a correlation with the period of oversampling, there is a possibility that improvement of SNR to be obtained by oversampling may be suppressed. For example, when a power of 2 times oversampling is performed, as indicated in FIG. 10A, and if the number of code data is also a power of 2, the correlation between each A/D conversion that is performed a power of two times and each code data becomes constant. Therefore, improvement of SNR and the like due to the synergetic effect of oversampling and code shifting would be suppressed.

Therefore, in accordance with the present embodiment, when A/D conversion is performed with a power of two times (2 times, 4 times, 8 times, 16 times, 32 times and the like) oversampling, the code data generation section 90 generates prime number sets of code data. For example, in the case of the example shown FIG. 8, the code data generation section 90 generates 31 (i.e., a prime number) sets of code data and sequentially outputs the same. By so doing, the correlation between each of the A/D conversions which are performed a power of two times and each of the sets of code data would not become constant. Therefore, it is possible to realize an improvement of the SNR and the like by the synergetic effect of oversampling and code shifting.

It is noted that the A/D conversion with oversampling is not limited to the method shown in FIG. 10A, and many modifications may be implemented. Also, the number of sets of code data and generation pattern is not limited to the example shown in FIG. 8.

Figure 10B:
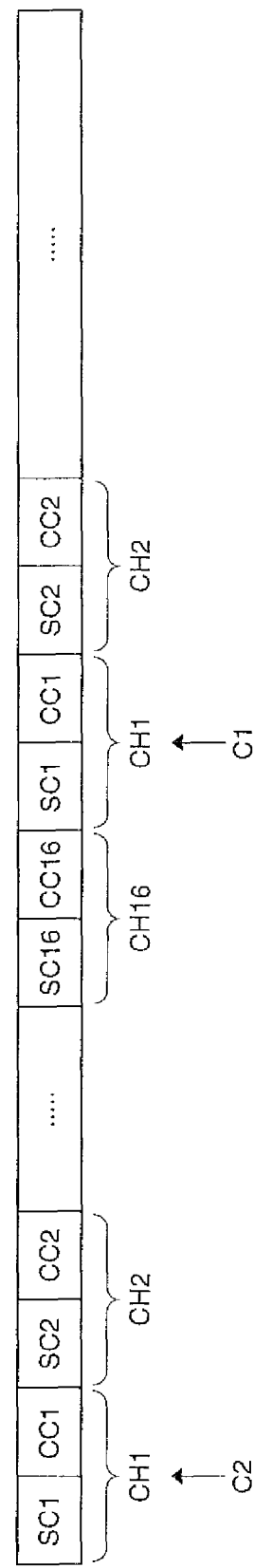

Also, when a signal with multiple channels is A/D converted by time division as shown in FIG. 9, the A/D converter circuit would operate in a manner shown in FIG. 10B. For example, after executing sampling SC1 and conversion CC1 for the signal of the channel CH1, sampling SC2 and conversion CC2 for the signal of the channel CH2 are executed. Thereafter, in a similar manner, sampling and conversion are sequentially executed for each of the channels CH3-CH16. In this case, when C1 in FIG. 10B is the current A/D conversion, C2 is the last A/D conversion. Therefore, the information register 84 in FIG. 7 stores judging result information of the last A/D conversion indicated at C2, and based on the judging result information at C2, code data in the current A/D conversion indicated by C1 is corrected.

5. Detailed Configuration Example

Figure 11:
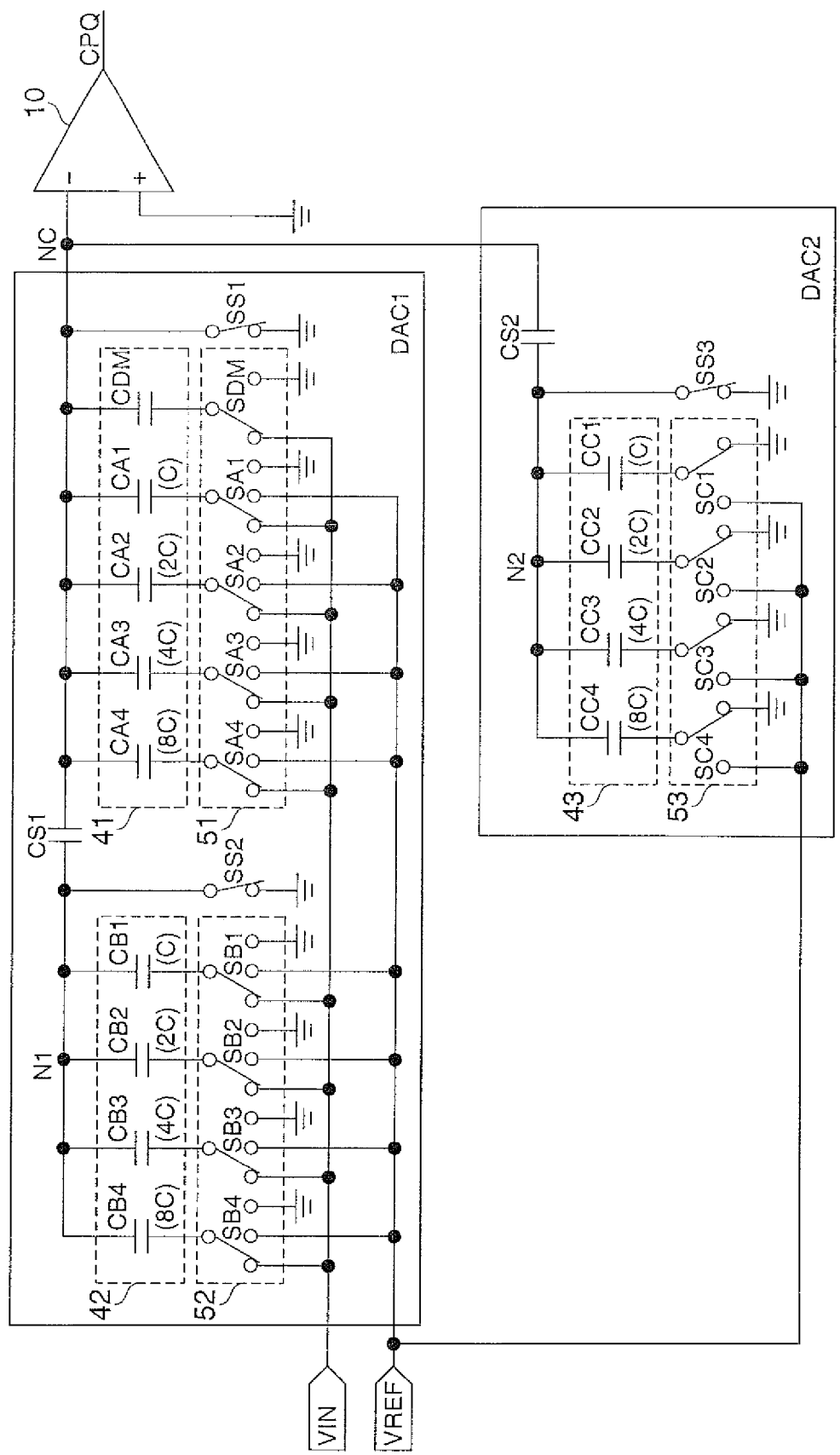
FIG. 11 is a diagram for explaining in detail an example of the configuration of an A/D converter circuit in accordance with an embodiment of the invention.

FIG. 11 shows a detailed exemplary configuration of an A/D converter circuit in accordance with an embodiment of the invention. FIG. 11 shows details of exemplary configurations of the DAC1, the DAC2 and the comparison circuit 10 shown in FIG. 1. The DAC1 and the DAC2 are formed from charge-redistribution type D/A converter circuits.

More specifically, the first D/A converter circuit DAC1 includes a first capacitor array section 41 and a first switch array section 51. Also, a first series capacitor CS1 is provided between a comparison node NC and a first node N1. Also, the DAC1 includes a second capacitor array section 42 and a second switch array section 52. The first D/A converter circuit also includes switching elements SS1 and SS2 for setting the nodes NC and N1 at GND (AGND).

It is noted that one end of a third series capacitor may be connected to the node N1, and a capacitor array section and a switch array section having configurations similar to those of the capacitor array section 42 and the switch array section 52 may be provided on the side of the other end of the third series capacitor.

The first capacitor array section 41 of the DAC1 includes a plurality of capacitors CA1-CA4. The capacitors CA1-CA4 have one ends connected to the comparison node NC of the comparison circuit 10. The comparison node NC (sampling node) is a node that is connected to a first input terminal (an inversion input terminal) of the comparison circuit 10. A second input terminal (a non-inversion input terminal) of the comparison circuit 10 is set at GND. Also, the capacitors CA1-CA4 are binary-weighted. For example, the capacitance values of the CA1, CA2, CA3 and CA4 are, for example, C, 2C, 4C and 8C, respectively, in the case of 4 bits. Also, the first capacitor array section 41 includes a dummy capacitor CDM.

The first switch array section 51 of the DAC1 includes a plurality of switching elements SA1-SA4. The switching elements SA1-SA4 are connected to the other ends of the capacitors CA1-CA4 of the first capacitor array section 41. The switching elements SA1-SA4 are switch-controlled based on data of upper bits of the data for successive approximation RDA (when the RDA is made up of 8 bits, data of upper four bits).

The second capacitor array section 42 of the DAC1 includes a plurality of capacitors CB1-CB4. The capacitors CB1-CB4 have one ends connected to the first node N1. The first node N1 is a node provided on the side of one end of the series capacitor CS1 having another end connected to the comparison node NC. Also, the capacitors CB1-CB4 are binary-weighted. For example, the capacitance values of the CB1, CB2, CB3 and CB4 are, for example, C, 2C, 4C and 8C, respectively, in the case of 4 bits.

The second switch array section 52 of the DAC1 includes a plurality of switching elements SB1-SB4. The switching elements SB1-SB4 are connected to the other ends of the capacitors CB1-CB4 of the second capacitor array section 42. The switching elements SB1-SB4 are switch-controlled based on data of lower bits of the data for successive approximation RDA (when the RDA is made up of 8 bits, data of lower four bits).

The second D/A converter circuit DAC2 includes a second series capacitor CS2 provided between the comparison node NC and a second node N2, and also includes a third switch array section 53. The second D/A converter circuit also includes a switching element SS3 for setting the second node N2 at GND during a sampling period.

The third capacitor array section 43 of the DAC2 includes a plurality of capacitors CC1-CC4. The capacitors CC1-CC4 have one ends connected to the second node N2. The second node N2 is a node provided on the side of one end of the series capacitor CS2 having another end connected to the comparison node NC. Also, the capacitors CC1-CC4 are binary-weighted. For example, the capacitance values of the CC1, CC2, CC3 and CC4 are, for example, C, 2C, 4C and 8C, respectively, in the case of 4 bits.

The third switch array section 53 of the DAC2 includes a plurality of switching elements SC1-SC4. The switching elements SC1-SC4 are connected to the other ends of the capacitors CC1-CC4 of the third capacitor array section 43. The switching elements SC1-SC4 are switch-controlled based code data CDA.

More specifically, the code data generation section 90 shown in FIG. 1 outputs code data CDA to the D/A converter circuit DAC2, and the switching elements SC1-SC4 are switch-controlled based on the code data CDA. For example, the code data generation section 90 outputs, as code data CDA, data whose value changes within a data range of data of lower bits of the data for successive approximation RDA at each timing or each plurality of timings of A/D conversion.

More specifically, in the case of 8-bit A/D conversion shown in FIG. 11, the code data CDA is changed within the data range of lower four bits of the data for successive approximation RDA. For example, the code data CDA may be randomly changed in a data range, for example, between 0000 and 1111 (or a data range narrower than the data range between 0000 and 1111), thereby switch-controlling the switching elements SC1-SC4 of the switch array section 53 of the D/A converter circuit DAC2. In this instance, the switching elements SB1-SB4 of the switch array section 52 of the D/A converter circuit DAC1 are also switch-controlled by data of lower four bits of the data for successive approximation RDA. By setting the range in which the code data CDA is changed to a data range of the data for successive approximation RDA for switch-controlling the switching elements SB1-SB4 of the DAC1, occurrence of missing codes can be effectively prevented.

Let us consider a case where the minimum resolution (a voltage that corresponds to the LSB, a quantized voltage) of the D/A converter circuit DAC1 is RS1, and the minimum resolution of the D/A converter circuit DAC2 is RS2. In this case, RS2=RS1 in FIG. 11. More specifically, for example, the series capacitors CS1 and CS2 have the same (generally the same) capacitance value, and the capacitance value of the capacitor CB1 corresponding to the LSB of the DAC1 is the same (generally the same) as the capacitance value of the capacitor CC1 corresponding to the LSB of the DAC2. In other words, the DAC2 outputs a code voltage that is greater than a noise voltage, not a noise voltage less than the minimum resolution RS1 (LSB) of the DAC1. By so doing, code shifting as shown in FIG. 3B can be realized. It is noted that the relation between R2 and R1 is not limited to RS2=RS1, by may be RS2≥RS1.

Figure 12:
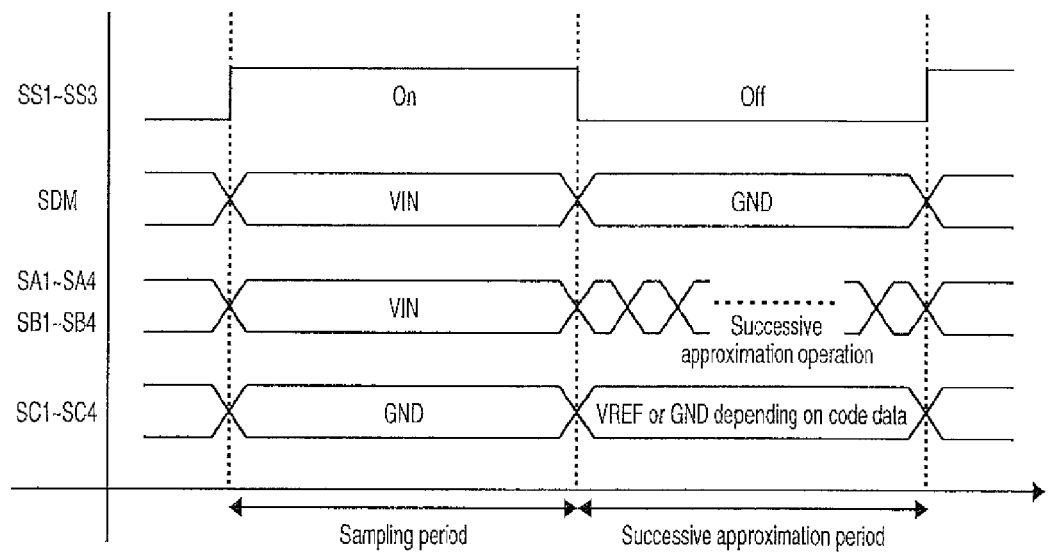
FIG. 12 is a diagram for explaining the operation of the A/D converter circuit.

Next, the operation of the present embodiment will be described in detail with reference to FIG. 12. As shown in FIG. 12, during the sampling period of an input signal VIN, the switching elements SS1 and SS2 of the main D/A converter circuit DAC1 are turned on, whereby the nodes NC and N1 are set at GND. Also, the other ends of the capacitors CA1-CA4 and CB1-CB4 are set at the voltage level of the VIN through the switching elements SA1-SA4 and SB1-SB4 of the D/A converter circuit DAC1.

By this operation, the input signal VIN is sampled. When the switching elements SA1-SA4 and SB1-SB4 are turned off, the voltage of the input signal VIN at this timing is held. During the sampling period, the other end of the dummy capacitor CDM is set at the voltage level of the VIN through the switching element SDM for the dummy capacitor.

Also, during the sampling period, the switching element SS3 of the D/A converter circuit for code shifting DAC2 is turned on, whereby the node N2 is set at GND. Also, the other ends of the capacitors CC1-CC4 are set at GND through the switching elements SC1-SC4. By this, both ends of the capacitors CC1-CC4 are set at GND, in a state in which charge cannot be stored.

Next, during the successive approximation period of A/D conversion, the switching elements SS1 and SS2 of the main D/A converter circuit DAC1 are turned off. Also, the other end of the switching element SDM for the dummy capacitor is set at GND.

Then, the switching elements SA1-SA4 and SB1-SB4 of the DAC1 are switch-controlled based on each of the bits of the data for successive approximation RDA, whereby the other ends of the capacitors CA1-CA4 and CB1-CB4 are set at VREF or GND.

For example, when the data for successive approximation RDA=10000000, the other end of the capacitor CA4 corresponding to the MSB of the RDA is set to a reference voltage VREF. Also, the other ends of the other capacitors CA3-CA1 and CB4-CB1 are set at GND.

Also, for example, when the data for successive approximation RDA=10001000, the other ends of the capacitor CA4 and CB4 are set to VREF. Also, the other ends of the other capacitors CA3-CA1 and CB3-CB1 are set at GND.

Also, during the successive approximation period of A/D conversion, the switching element SS3 of the D/A converter circuit DAC2 for code shifting is turned off. Then, the switching elements SC1-SC4 of the DAC2 are switch-controlled based on each of the bits of the code data CDA, whereby the other ends of the capacitors CC1-CC4 are set at VREF or GND.

For example, when the code data CDA=1000, the other end of the capacitor CC4 is set at VREF, and the other ends of the other capacitors CC3-CC1 are set at GND. Also, when the code data CDA=1100, the other ends of the capacitors CC4 and CC3 are set at VREF, and the other ends of the other capacitors CC2 and CC1 are set at GND.

In this case, the code data CDA changes at each of the A/D conversion timing shown in FIG. 12. In other words, the code data CDA changes at each timing of A/D conversion which is composed of the sampling period and the successive approximation period. It is noted that the code data CDA may be changed at each plurality of timings of A/D conversion.

In the case of the charge-redistribution type A/D converter circuit shown in FIG. 11, the process of comparing a sampling signal (a sampling voltage) of VIN with an added signal (an added voltage) of a D/A output signal and a code signal (a code voltage) is performed. In this case, the control circuit 20 shown in FIG. 1 performs a process of adding code data CDA to successive approximation result data QDA of the successive approximation register SAR.

More specifically, during the sampling period, charge according to the input signal VIN is stored in the capacitors CA1-CA4 and CB1-CB4. Then, the charge stored according to VIN is compared with the charge stored in the capacitors CA1-CA4, CB1-CB4 and CC1-CC4 according to the data for successive approximation RDA and the code data CDA during the successive approximation period. Then, data for successive approximation RDA at the time when these charges coincide with each other is outputted from the successive approximation register SAR as successive approximation result data QDA. Then, data in which code data CDA is added to the successive approximation result data QDA is outputted as data DOUT, which is the input signal VIN that is A/D converted. According to the above, code shifting with code data CDA shown in FIG. 3B is realized, while appropriate A/D converted data can be outputted.

Figure 13:
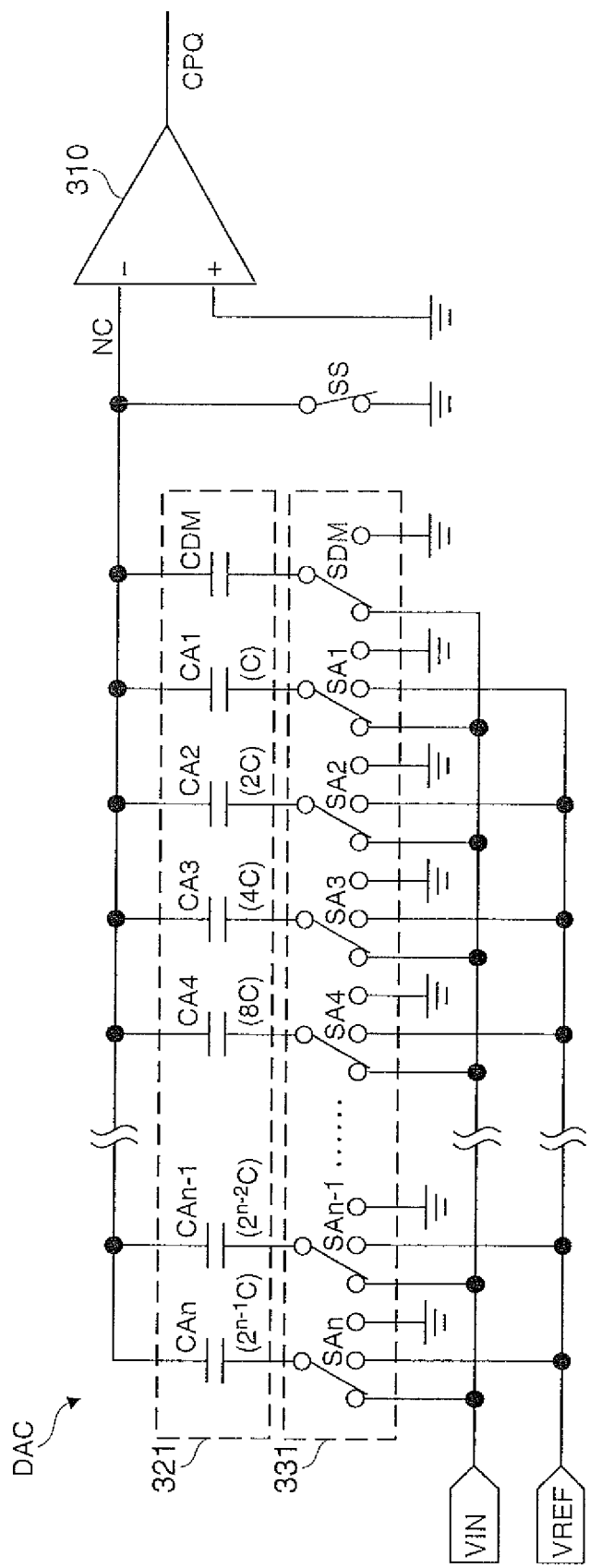
FIG. 13 shows a second comparison example of an A/D converter circuit.

FIG. 13 shows an A/D converter circuit in accordance with a second comparison example, to be compared with the present embodiment. The second comparison example is an example in which the first comparison example in FIG. 2 is realized in a charge-redistribution type, and a D/A converter circuit DAC (and an S/H circuit 330) is realized with a capacitor array section 321, a switch array section 331 and a switching element SS.

A major factor to determine the conversion accuracy of the A/D converter circuit is the conversion accuracy of the DAC. In the second comparison example shown in FIG. 13, when the resolution of the DAC is n-bit, the capacitor array section 321 is formed from n binary-weighted capacitors CA1-CAn, and one dummy capacitor CDM. During the sampling period, other ends of the capacitors CA1-CAn are connected to the input signal VIN, and the comparison node NC is set at GND.

Then, during the successive approximation period, successive approximation process is performed sequentially from the most significant bit MSB. More specifically, the other ends of the capacitors CA1-CAn are switched to be connected to the reference voltage VREF or GND according to the input value of the D/A converter circuit, using the switching elements SA1-SAn of the switch array section 331. By this, the voltage on the comparison node NC of the inversion input terminal of the comparison circuit 310 becomes to be a voltage that is obtained by subtracting the sampled voltage of the VIN from the output value of the DAC.

However, according to the second comparison example shown in FIG. 13, the resolution of the A/D converter circuit is set, for example, at 12 bits. When the resolution of the DAC is 12 bits, a capacitance value of $2^{12} \times C$ is required in total. Therefore, the circuit becomes large in scale, and large current is necessary for charging the capacitors. The higher the resolution of the A/D converter circuit, the greater this tendency becomes. Therefore, the second comparison example of FIG. 13 has a problem as it has a limitation in higher bit implementation.

Figure 14:
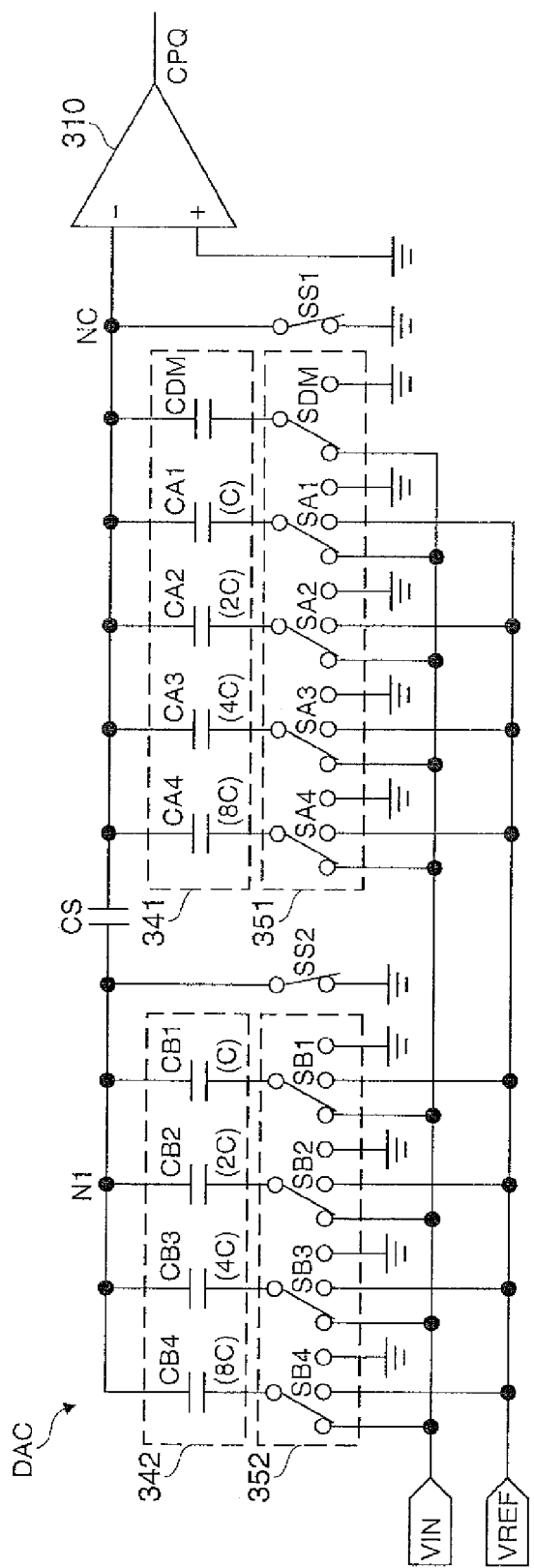
FIG. 14 shows a third comparison example of an A/D converter circuit.

FIG. 14 shows a third comparison example of A/D conversion, to be compared with the embodiment. The third comparison example is provided with a series capacitor CS, and configured with binary-weighted capacitors in multiple stages to solve the problem of the second comparison example described above. More specifically, the series capacitor CS is provided with one end thereof connected to the comparison node NC, and the other end connected to the node N1. Also, the third comparison example is provided with a capacitor array section 341 connected to the comparison node NC and a switch array section 351 for switch-controlling the capacitor array section 341, and a capacitor array section 342 connected to a node N1 and a switch array section 352 for switch-controlling the capacitor array section 342.

According to the configuration of the third comparison example shown in FIG. 14, for example, the capacitance value of the capacitor CA1 of the capacitor array section 341 and the capacitance value of the capacitor CB1 of the capacitor array section 342 can be made to be the same. Accordingly, in the case of an 8-bit implementation, for example, the second comparison example shown in FIG. 13 needs a capacitance value of $2^8 \times C$, but the third comparison example shown in FIG. 14 only needs a capacitance value of $2^5 \times C$. Therefore, the circuit can be made smaller in area, and the charge current for the capacitors can be made smaller.

However, the third comparison example of FIG. 14 entails a problem in that parasitic capacitance at the node N1 would deteriorate DNL (Differential Non Linearity) and INL (Integral Non Linearity) of the DAC. This problem is caused by an error generated in the ratio of binary weighted capacitances by the parasitic capacitance. For example, as in the case of 8-bit implementation shown in FIG. 14, this adverse effect becomes more prominent near a code at which the fifth bit from the LSB changes. More specifically, such an error would occur at the turn from 00001111 to 00010000 (MSB is the first), and a problem of a missing code as shown in FIG. 3A is generated.

As a method to solve the problem described above, it is possible to use a technique of micro-adjusting the characteristic by trimming the capacitance value of the series capacitor CS. However, the trimming alone has a limitation in the capacitance unit and range to be trimmed. Also, a trimming process is required in the manufacturing process, which leads to a higher cost. Also, a digital compensation process of digitally correcting A/D converted data may possibly be used to increase the accuracy. However, this would lead to other problems in which the process becomes more complicated and extra processing steps are required.

Next, referring to FIG. 15, theoretical formulas of an SAR type ADC when parasitic capacitances CP1 and CP2 are added to the nodes NC and N1 will be described. Theoretical formulas that do not include the parasitic capacitances CP1 and CP2 can be derived by setting CP1 and CP2 as zero (0). It is noted that the capacitance values of the capacitors CA1 and CB1, CA2 and CB2, CA3 and CB3, and CA4 and CB4 are assumed to be C, 2C, 4C and 8C, respectively. Also, the capacitance value of the series capacitor CS is assumed to be C. The dummy capacitor CDM is used for the purpose of adjusting (for full-scale adjusting) the charge amount to be stored at the sampling. However, here, the capacitance value of the dummy capacitor CDM is ignored for the sake of simplification of the description.

Figure 15:
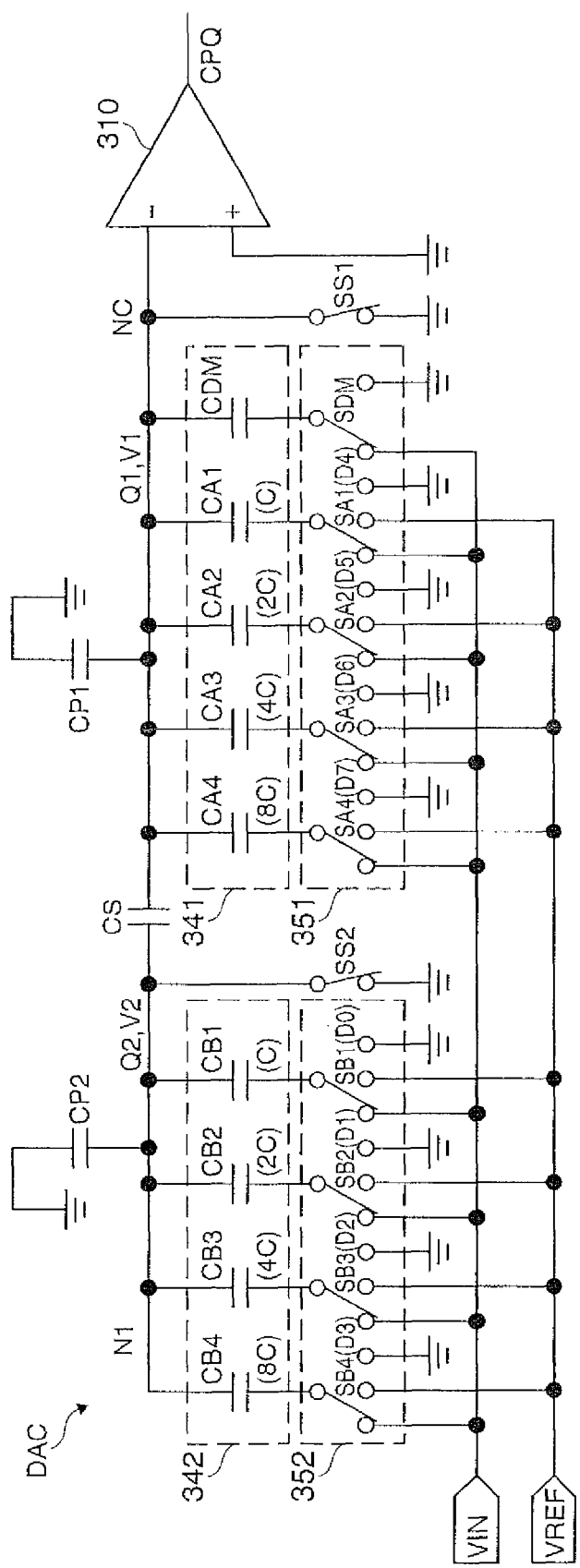
FIG. 15 is a diagram for explaining adverse effects caused by parasitic capacitances.

FIG. 15 shows a state of the switching elements during the sampling period. The amount of charge Q1 to be charged at the node NC during the sampling period is expressed by Formula (1) below.

[Formula 1]

$$Q1 = (C + 2C + 4C + 8C)(0 - VIN) \qquad (1)$$
$$= -15C \cdot VIN$$

The amount of charge Q2 that is charged at the node N1 during the sampling period is expressed by Formula (2) below.

[Formula 2]

$$Q2 = (C + 2C + 4C + 8C)(0 - VIN) \qquad (2)$$
$$= -15C \cdot VIN$$

The voltage on both ends of the series capacitor CS and the parasitic capacitance CP1 and CP2 is at GND (at ground potential), such that no electric charge is charged.

Next, the voltage V1 at the node NC and the voltage V2 at the node N1 during the successive approximation period are obtained. For example, in FIG. 15, the switching elements SB1-SB4 are switch-controlled by lower four bits D0-D3 of the data for successive approximation RDA, and the switching elements SA1-SA4 are switch-controlled by upper four bits D4-D7 of the RDA. More specifically, in the case of a bit Di=1 (0≤i≤7), VIN is connected. In the case of a bit Di=0, GND is connected. In this case, the charge amounts Q1 and Q2 charged at the nodes NC and N1 during the successive approximation period are expressed by Formulas (3) and (4) below.

[Formula 3]

$$Q1 = CP1(V1-0) + CS(V1-V2) + C(V1-VREF \cdot D0) + 2C(V1-VREF \cdot D1) + 4C(V1-VREF \cdot D2) + 8C(V1-VREF \cdot D3) \quad (3)$$

[Formula 4]

$$Q2 = CP2(V2-0) + CS(V2-V1) + C(V2-VREF \cdot D4) + 2C(V2-VREF \cdot D5) + 4C(V2-VREF \cdot D6) + 8C(V2-VREF \cdot D7) \quad (4)$$

According to the law of conservation of charge, the charge amounts Q1 in Formula (1) and Formula (3) are equal to each other, and the charge amounts Q2 in Formula (2) and Formula (4) are equal to each other. When the comparison operation for the entire bits D0-D7 of the data for successive approximation RDA is completed, the voltage on the node NC at the inversion input terminal of the comparison circuit 310 becomes equal to GND at the non-inversion input terminal, and therefore Formula (5) below is established.

[Formula 5]

$$V1 = 0 \quad (5)$$

Accordingly, simultaneous equations of Formulas (1)-(5) are solved to obtain VIN, as expressed by Formula (6) below.

[Formula 6]

$$VIN = \frac{VREF}{255C + 15CP2}\left[\begin{pmatrix} D0 + 2D1 + 4D2 + 8D3 + 16D4 + \\ 32D5 + 64D6 + 128D7 \end{pmatrix}C + (D4 + 2D5 + 4D6 + 8D7)CP2\right] \quad (6)$$

As is clear from Formula (6), the A/D conversion result of VIN is not affected by the parasitic capacitance CP1 of the node NC, and only the parasitic capacitance CP2 at the node N2 adversely affects the characteristic. Therefore, trimming of the series capacitor CS is necessary in order to reduce the adverse effect of the parasitic capacitance CP2. Also, it is understood from Formula (5) that the adverse effect of the parasitic capacitance CP2 appears when connection of the switching elements corresponding to bits at D4 and higher changes, whereby a missing code as shown in FIG. 3A is generated.

Figure 16A:
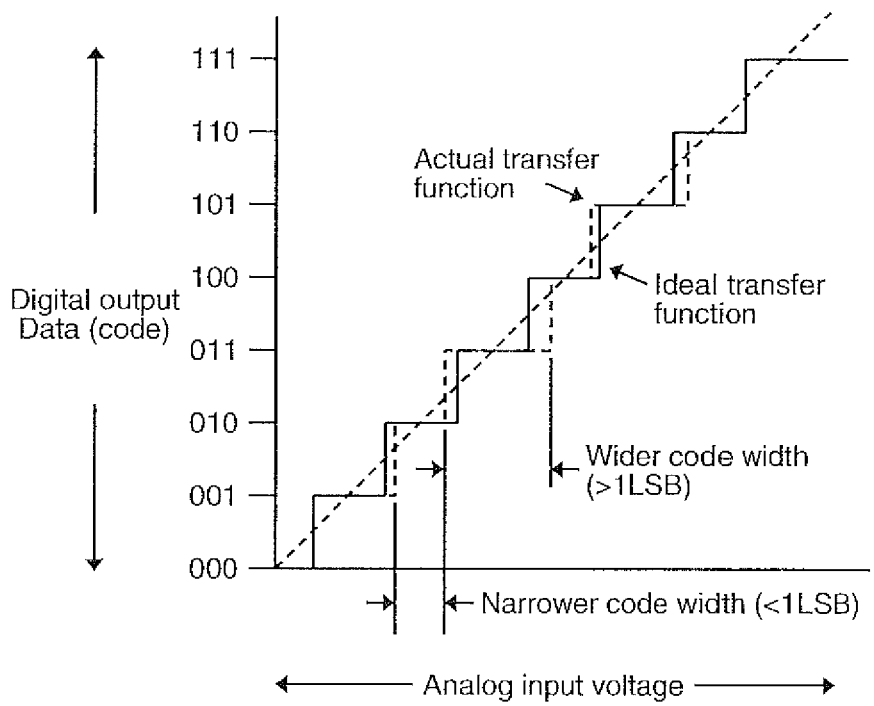
FIGS. 16A and 16B are graphs for explaining DNL and INL.
Figure 16B:
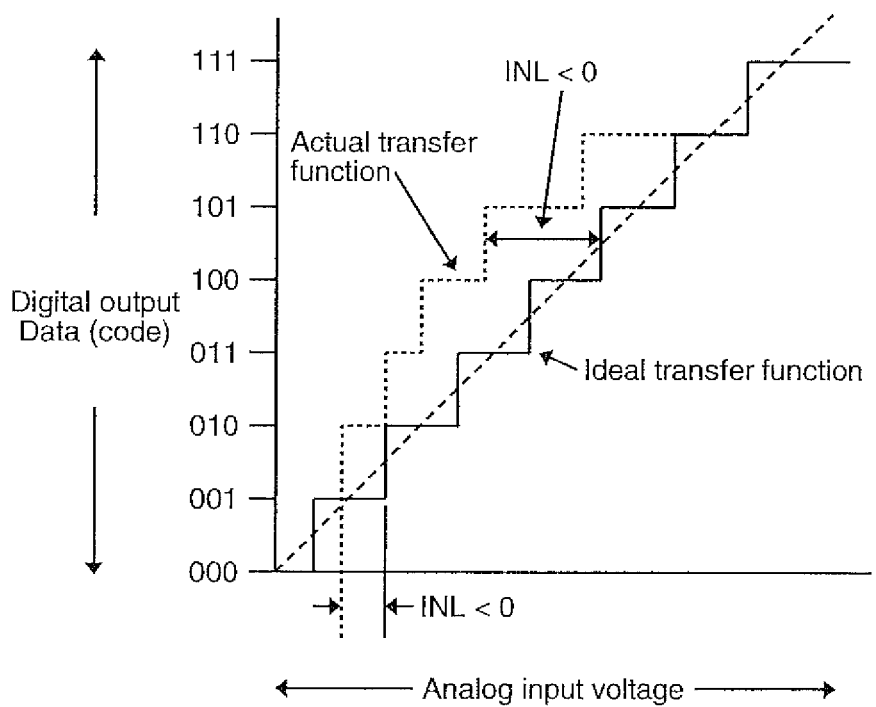

FIG. 16A and FIG. 16B are graphs for explaining differential non-linearity (DNL) and integral non-linearity (INL). DNL indicated in FIG. 16A expresses a difference between the ideal code width and the measured code width. For example, in FIG. 16A, due to deterioration in the DNL characteristic, the code width for 010 becomes narrower, and the code width for 011 becomes wider. When the code width for 010 further gets narrower and disappear, the code for 010 turns to be a missing code as shown in FIG. 3A.

INL shown in FIG. 16B expresses the maximum deviation between an actual code transition point (shown in a broken line) and the corresponding ideal transition point (shown in a solid line). Positive INL indicates that the transition is behind the ideal one, and negative INL indicates that the transition is earlier than the ideal one.

Figure 17A:
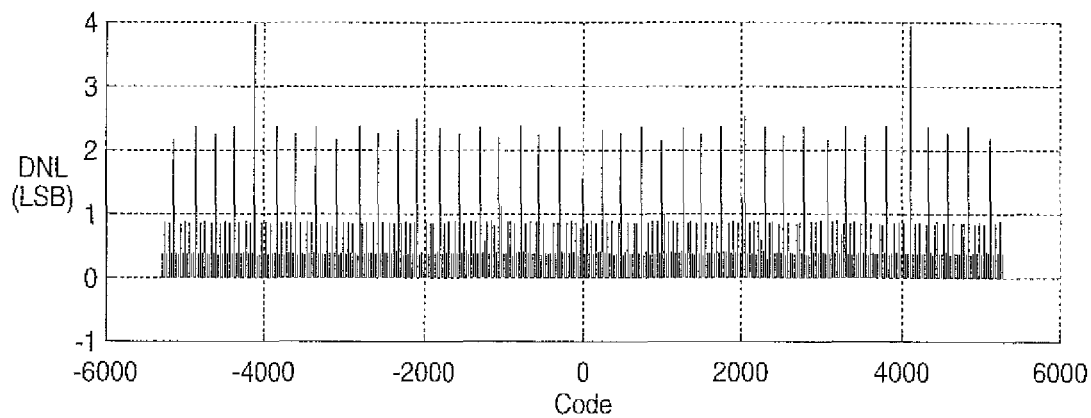
FIGS. 17A and 17B are graphs showings examples of DNL simulation results.
Figure 17B:
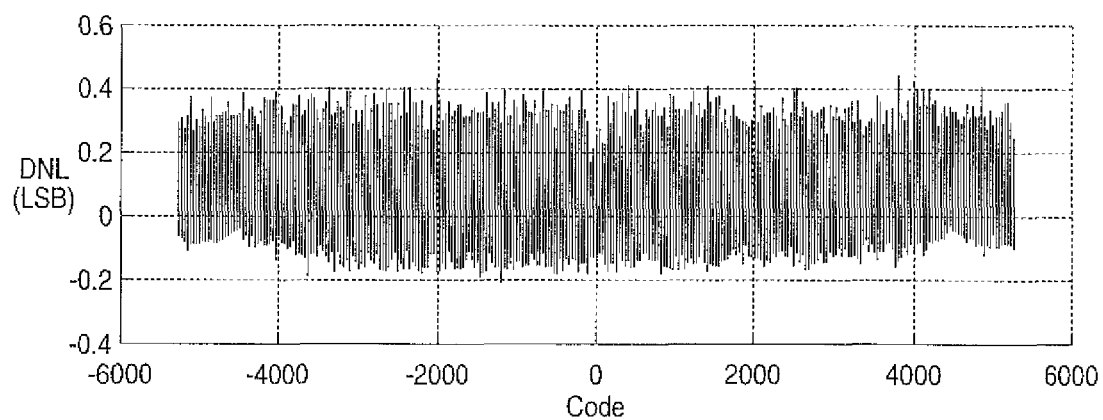

FIG. 17A and FIG. 17B show examples of results of DNL simulation. Here, an example is described. In the example, a fully differential A/D converter circuit (to be described below) is used, the main DAC1 is a 14-bit DAC, and the DAC2 for code shifting is a 4-bit DAC. In FIG. 11, the main DAC1 has a series configuration in two states of 4 bits+4 bits. The 14-bit main DAC1 in this example has a three-stage configuration of 6 bits+4 bits+4 bits.

FIG. 17A shows an example of the result of DNL simulation when the code shift method in accordance with the present embodiment is not used. In FIG. 17A, missing codes in which DNL is over 1 LSB are generated.

FIG. 17B shows an example of the result of DNL simulation when the code shift method in accordance with the present embodiment is used. In FIG. 17B, DNL is less than 1 LSB, and generation of mission codes is prevented.

In contrast to the third comparison example shown in FIG. 14, in accordance with the embodiment described above, the DAC2 for code shifting is added, as shown in FIG. 11, whereby code shifting is realized through adding a signal of code data by the DAC2.

More specifically, according to the third comparison example, missing codes shown in FIG. 3A and FIG. 17A are generated due to the parasitic capacitance CP2 at the node N1. In contrast, in accordance with the present embodiment, a signal of code data that changes over time is added by the DAC2, such that deterioration of DNL (missing code) that is occurring at a specified code is diffused into neighboring codes. For example, when a missing code occurs at the fourth bit from the MSB at 00010000, a signal of random code data that changes in a data range between 0000 and 1111 is added. By so doing, DNL can be suppressed to less than 1 LSB, as shown in FIG. 3B and FIG. 17B, whereby generation of missing codes can be prevented. Accordingly, even when the series capacitor CS1 is provided to reduce the circuit scale, generation of missing codes due to the parasitic capacitance at the node N1 can be prevented. As a result, both circuit scale reduction and prevention of deterioration of the A/D conversion characteristic can be achieved.

6. Fully Differential Type

Figure 18:
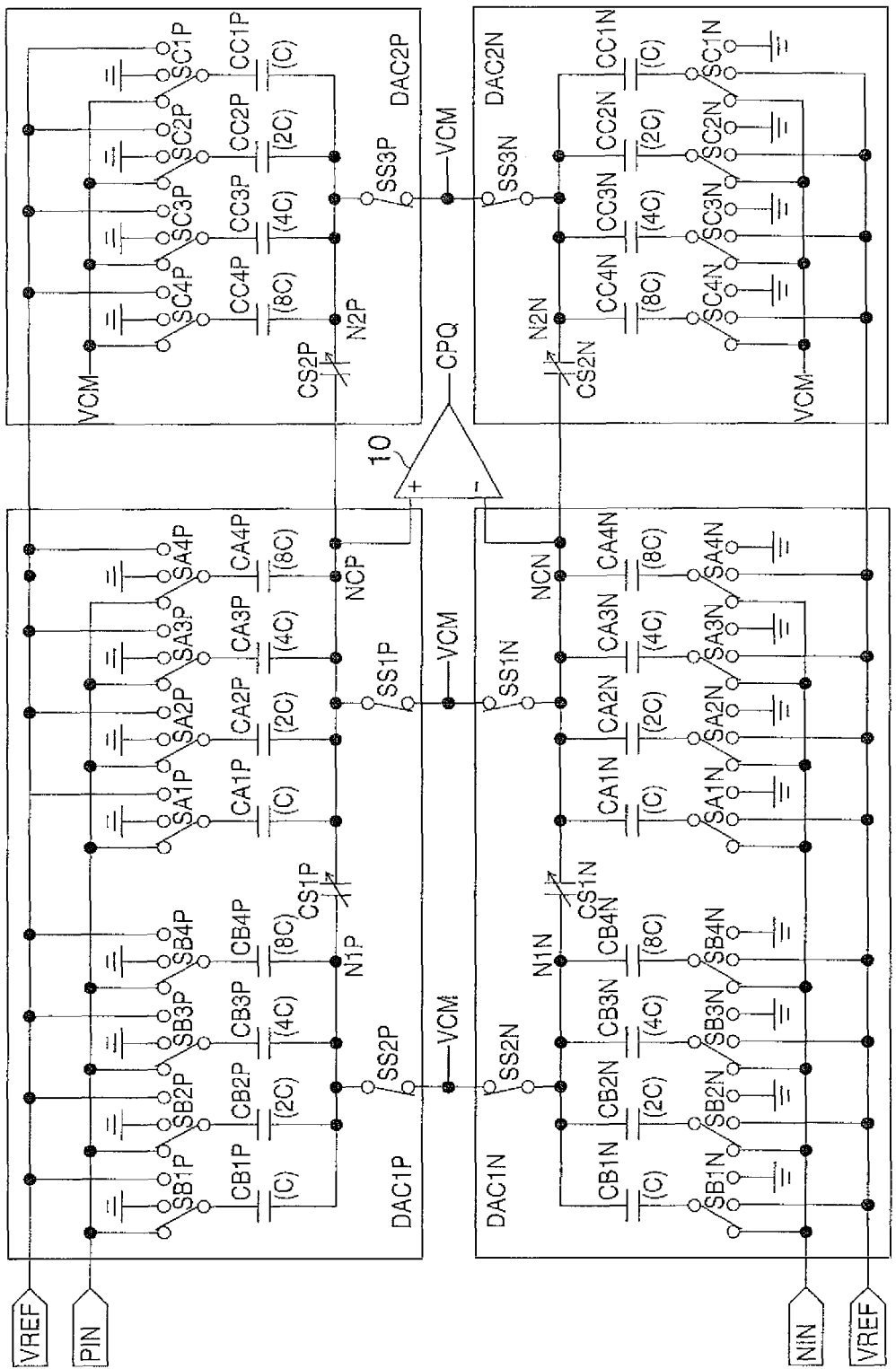
FIG. 18 is a diagram of an exemplary configuration of a fully differential type A/D converter circuit.

FIG. 18 shows an exemplary configuration of a fully differential type A/D converter circuit using the code shift method in accordance with the embodiment of the invention. The A/D converter circuit shown in FIG. 18 includes a comparison circuit 10, a main D/A converter circuit DAC1P connected to a non-inversion input terminal of the comparison circuit 10, and a main D/A converter circuit DAC1N connected to an inversion input terminal of the comparison circuit 10. The A/D converter circuit also includes a D/A converter circuit for code shifting DAC2P that is connected to the non-inversion input terminal of the comparison circuit 10, and a D/A converter circuit for code shifting DAC2N that is connected to the inversion input terminal of the comparison circuit 10.

The configuration of the main DAC1P on the non-inversion side (positive side) and the configuration of the main DAC1N on the inversion side (negative side) each include a capacitor array section and a switch array section, like the main DAC1 shown in FIG. 11. An input signal PIN on the non-inversion side (positive side) composing a differential signal is inputted in the DAC1P, and an input signal NIN on the inversion side (negative side) composing the differential signal is inputted in the DAC1N.

During the sampling period, nodes NCP and N1P of the DAC1P are set to a common voltage (an intermediate voltage) VCM through switching elements SS1P and SS2P. Also, nodes NCN and N1N of the DAC1N are set to the common voltage VCM through switching elements SS1N and SS2N.

Also, during the sampling period, one ends of switching elements SA1P-SA4P and SB1P-SB4P of the DAC1P are connected to the signal PIN on the non-inversion side of the differential signal, and one ends of switching elements SA1N-SA4N and SB1N-SB4N of the DAC1N are connected to the signal NIN on the inversion side of the differential signal.

On the other hand, during the successive approximation period, the ends of the switching elements SA1P-SA4P and SB1P-SB4P of the DAC1P are connected to VREF when a corresponding bit of data for successive approximation is "1," and connected to GND when it is "0."

In contrast, the ends of the switching elements SA1N-SA4N and SB1N-SB4N of the DAC1N are connected to GND when a corresponding bit of data for successive approximation is "1," and connected to VREF when it is "0."

The DAC2P for code shifting on the non-inversion side and the DAC2N for code shifting on the inversion side each include a capacitor array section and a switch array section, like the DAC2 for code shifting shown in FIG. 11.

During the sampling period, a node N2P of the DAC2P is set to VCM by a switching element SS3P. Also, a node N2N of the DAC2N is set to VCM by a switching element SS3N. Further one ends of switching elements SC1P-SC4P of the DAC2P and one ends of switching element SC1N-SC4N of the DAC2N are connected to VCM.

On the other hand, during the successive approximation period, the one ends of the switching elements SC1P-SC4P of the DAC2P are connected to VREF when a corresponding bit of code data is "1," and connected to GND when it is "0." In contrast, the one ends of the switching elements SC1N-SC4N of the DAC2N are connected to GND when a corresponding bit of code data is "1," and connected to VREF when a corresponding bit of code data is "0."

The configuration shown in FIG. 18, together with the code shifting method, can also improve DNL and INL of the A/D converter circuit, and prevent generation of missing codes and the like. Also, by configuring the A/D converter circuit in a fully differential type, large amplitudes can be secured, the SIN ratio can be improved, and influence of common mode noise can be reduced.

7. Electronic Apparatus

Figure 19:
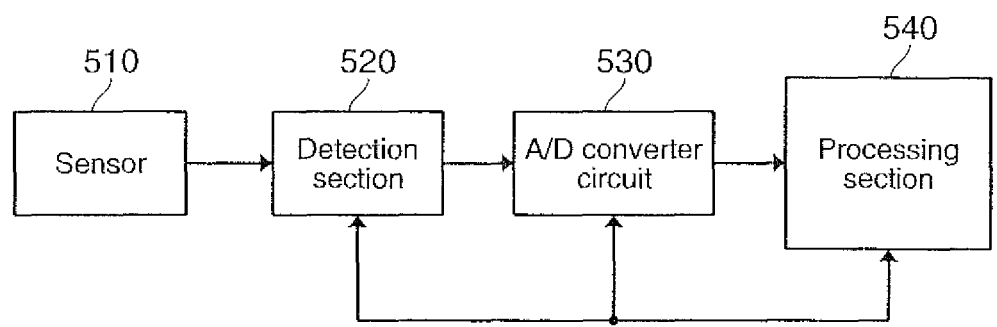
FIG. 19 shows an exemplary configuration of an electronic apparatus in accordance with an embodiment of the invention.

FIG. 19 shows an exemplary configuration of an electronic apparatus including the A/D converter circuit in accordance with the present embodiment. The electronic apparatus includes a sensor 510, a detection circuit 520, an A/D converter circuit 530, and a processing section 540. It is noted that various modifications, such as, omission of a part of the components, addition of other components and the like can be made. For example, the detection circuit 520, the A/D converter circuit 530 and the processing section 540 can be realized by an integrated circuit device.

The electronic apparatus shown in FIG. 19 can be implemented in any one of a variety of apparatuses, such as, for example, a biometric apparatus (a heart rate monitor, a pedometer and the like), a portable information terminal, an imaging apparatus (a digital camera, a video camera), a time keeping device, and the like.

The sensor 510 may be a gyro-sensor, an acceleration sensor, a photo sensor, a pressure sensor, or the like, and any one of various kinds of sensors according to the specific use of the electronic apparatus can be used. The detection circuit 520 amplifies a sensor signal outputted from the sensor 510, and extracts a desired signal therefrom. Also, the A/D converter circuit 530 converts the detected signal (the desired signal) from the detection signal 520 into digital data, and outputs the same to the processing section 540.

The processing section 540 executes a digital signal processing required for the digital data from the A/D converter circuit 530. Also, the processing section 540 may perform gain control of the detection circuit 520 and the like. The digital signal processing performed by the processing section 540 includes various kinds of processing, such as, high-speed Fourier transform to extract an appropriate desired signal from the sensor signal.

The embodiments of the invention are described above in detail. However, those skilled in the art should readily understand that many modifications can be made without departing in substance from the novel matter and effects of the invention. Accordingly, those modified examples are also included in the scope of the invention. For example, throughout the specification and the drawings, terms described at least once with terms that are in a broader sense or synonymous can be replaced with these different terms in any sections of the specification and the drawings. Also, all combinations of the embodiments and the modification examples are deemed to be included in the scope of the invention. Further, the configurations and operations of the A/D converter circuit and the electronic apparatus, the A/D conversion method, the code generation method, and the code shifting method are not limited to those described above in the embodiments, and many modifications can be made. For example, FIG. 11 shows an example of the main DAC1 that is configured in two stages, but it can be configured in three or more stages.

The entire disclosure of Japanese Patent Application No. 2010-249949, filed Nov. 8, 2010 is expressly incorporated by reference herein.

What is claimed is:

1. An electronic apparatus comprising:
   a sensor;
   a detection circuit that amplifies a sensor signal outputted from the sensor and extracts a desired signal; and
   a A/D converter circuit that converts the desired signal from the detection signal into digital data;
   wherein the A/D converter circuit comprises:
   a comparison circuit;
   a control circuit that has a successive approximation register with a register value set by a comparison result signal from the comparison circuit, and outputs data for successive approximation;
   a first D/A converter circuit that D/A converts the data for successive approximation from the control circuit, and outputs a D/A output signal corresponding to the data for successive approximation;
   a second D/A converter circuit that D/A converts code data that changes over time, and outputs a code signal corresponding to the code data; and
   a correction section that performs a correction process,
   the comparison circuit performing a process to compare an added signal of a sampled signal of an input signal and the code signal with the D/A output signal, or a process to compare the sampled signal with an added signal of the D/A output signal and the code signal, the control circuit outputting output data obtained based on successive approximation result data of the successive approximation register and the code data as A/D conversion data of the input signal, and the correction section performing a correction process to correct the successive approximation result data so as not to overflow due to code shifting using the code data.

2. An electronic apparatus according to claim 1, wherein, when the minimum resolution of the first D/A converter circuit is RS1, and the minimum resolution of the second D/A converter circuit is RS2, RS1 and RS2 have a relation of RS2≥RS1.

3. An electronic apparatus according to claim 1, wherein the correction section performs the correction process through correcting the code data.

4. An electronic apparatus according to claim 3, wherein the correction section performs the correction process through correcting the data code based on last successive approximation result data that is successive approximation result data in the last A/D conversion.

5. An electronic apparatus according to claim 4, wherein, when the last successive approximation result data is data corresponding to a first range on a high potential side of an A/D input voltage range, the correction section performs the correction process on the code data such that the successive approximation result data in the current A/D conversion shifts to a low potential side, and when the last successive approximation result data is data corresponding to a second range on a low potential side of the A/D input voltage range, the correction section performs the correction process on the code data such that the successive approximation result data in the current A/D conversion shifts to a high potential side.

6. An electronic apparatus according to claim 5, further comprising a code data generation section that generates the code data and outputs the code data to the second D/A converter circuit, wherein the code data generation section generates the code data that alternately becomes positive and negative, and outputs the code data to the second D/A converter circuit, when the last successive approximation result data is data in a third range between the first range and the second range.

7. An electronic apparatus according to claim 5, wherein the correction section includes an information register that stores information indicative of whether the last successive approximation result data is data corresponding to the first range or the second range.

8. An electronic apparatus according to claim 7, wherein, when a signal with a plurality of channels is A/D converted by time division, the information register stores the information, for each of the plurality of channels, indicative of whether the last successive approximation result data is data corresponding to the first range or the second range.

9. An electronic apparatus according to claim 1, further comprising a code data generation section that generates the code data and outputs the code data to the second D/A converter circuit, wherein the code data generation section outputs data with a value that becomes different at each timing or each plurality of timings of A/D conversion within a predetermined data range.

10. An electronic apparatus according to claim 9, wherein the code data generation section outputs prime number sets of code data when A/D conversion is performed with a power of two times oversampling.

11. An electronic apparatus according to claim 1, wherein the first D/A converter circuit and the second D/A converter circuit are charge-redistribution type D/A converter circuits.

12. An electronic apparatus according to claim 11, wherein the first D/A converter circuit includes:

a first capacitor array section having a plurality of capacitors with one ends connected to a comparison node of the comparison circuit, a first switch array section having a plurality of switching elements that are connected to other ends of the plurality of capacitors of the first capacitor array section and switch-controlled based on higher bit data of the data for successive approximation, a first series capacitor provided between the comparison node and a first node, a second capacitor array section having a plurality of capacitors with one end connected to the first node, and a second switch array section having a plurality of switching elements that are connected to other ends of the plurality of capacitors of the second capacitor array section and switch-controlled based on lower bit data of the data for successive approximation, and the second D/A converter circuit includes:

a second series capacitor provided between the comparison node and a second node, a third capacitor array section having a plurality of capacitors with one ends connected to the second node, and a third switch array section having a plurality of switching elements that are connected to other ends of the plurality of capacitors of the third capacitor array section and switch-controlled based on the code data.

13. An electronic apparatus according to claim 1, wherein the control circuit performs a process of subtracting the code data from the successive approximation result data of the successive approximation register, when the process of comparing an added signal of the sampled signal and the code signal with the D/A output signal is performed.

14. An electronic apparatus according to claim 1, wherein the control circuit performs a process of adding the code data to the successive approximation result data of the successive approximation register, when the process of comparing the sampled signal with an added signal of the D/A output signal and the code signal is performed.

15. An electronic apparatus according to claim 1, further comprising a processing section executes a digital signal processing for the digital data.

* * * * *